United States Patent
Ohshima

(10) Patent No.: US 6,831,821 B2
(45) Date of Patent: Dec. 14, 2004

(54) SEMICONDUCTOR SWITCHING DEVICE WITH FUNCTION FOR VIBRATING CURRENT, THEREBY SHUTTING DOWN OVER-CURRENT

(75) Inventor: Shunzou Ohshima, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 486 days.

(21) Appl. No.: 09/908,973

(22) Filed: Jul. 20, 2001

(65) Prior Publication Data

US 2002/0012216 A1 Jan. 31, 2002

(30) Foreign Application Priority Data

Jul. 24, 2000 (JP) .................................... P 2000-222982
Nov. 29, 2000 (JP) .................................... P 2000-363644

(51) Int. Cl.[7] ............................ H02H 3/08; H02H 9/02
(52) U.S. Cl. ........................................ 361/86; 361/93.1
(58) Field of Search ............................. 361/93.1, 93.7, 361/98; 307/32

(56) References Cited

U.S. PATENT DOCUMENTS 5,375,029 A * 12/1994 Fukunaga et al. .......... 361/101
5,400,206 A * 3/1995 Barnes et al. .................. 361/72
5,895,989 A * 4/1999 Imaizumi et al. ........... 307/139
5,926,010 A 7/1999 Hosokawa et al.
6,140,806 A * 10/2000 Gohara ....................... 323/282
6,147,470 A * 11/2000 Ohashi et al. .............. 318/757
6,335,577 B1 * 1/2002 Baba ........................... 307/28

FOREIGN PATENT DOCUMENTS

EP          0402928 A3      12/1990
EP          0402928 A2      12/1990

* cited by examiner

Primary Examiner—Brian Sircus
Assistant Examiner—Z Kitov
(74) Attorney, Agent, or Firm—Finnegan, Henderson, Farabow, Garrett & Dunner L.L.P.

(57) ABSTRACT

A reference current (Iref) that includes a constant component current (Irefc) and a transient component current (Ireft) is fed to the reference FET (QB) such that a source potential (VSA) of the main FET (QA) when a load current (ID) flowing a main FET (QA) is not within the range of an over-current containing a transient component is not lower than a source potential (VSB) of a reference FET (QB). A reference current (Iref) vibrates by detecting that a source potential (VSA) of the main FET is lower than a source potential (VSB) of a reference FET. A vibration number of times is counted up to a predetermined number of times, thereby turning OFF the main FET (QA).

8 Claims, 17 Drawing Sheets

SEMICONDUCTOR SWITCHING DEVICE WITH FUNCTION FOR VIBRATING CURRENT, THEREBY SHUTTING DOWN OVER-CURRENT

CROSS REFERENCE TO RELATED APPLICATIONS

The subject application claims benefit of the earlier filing dates of Japanese Patent Application Nos. 2000-222982 and 2000-363644 filed on Jul. 24, 2000 and Nov. 29, 2000 under the Paris Convention, the entire contents of which are incorporated by reference herein.

BACKGROUND OF THE INVENTION

1. Field of the Invention

The present invention relates to a semiconductor switching device for detecting and shutting down an over-current caused by current vibration. More particularly, the present invention relates to a semiconductor switching device capable of detecting an over-current even when a rush current supplies a load, such as a lamp load or a motor load.

2. Description of the Related Art

A conventional semiconductor switching device (power semiconductor device) is employed for power supply control. The semiconductor switching device selectively supplies a battery power to respective loads in an automobile. The semiconductor switching device controls the power supply to a load by an incorporated thermal FET.

The semiconductor switching device has a shunt resistor. One end of the shunt resistor is connected to a power supply for supplying an output voltage VB. Further, a drain terminal of the thermal FET is connected to the other end of the shunt resistor. A load is connected to a source terminal of the thermal FET and is applied to automobile headlights or power window driving motor and the like. The semiconductor switching device is provided with an A/D converter and a microcomputer (CPU) for controlling the ON/OFF state of a drive signal of the thermal FET based on a current value monitored by the shunt resistor. Further, the semiconductor switching device includes a driver for controlling the thermal FET, under the control of the A/D converter and microcomputer (CPU).

The thermal FET incorporates a power device (mainly the FET), a resistor, a temperature sensor, a latch circuit, and an overheat shutdown FET. The foregoing elements configure a gate shutdown circuit. The gate shutdown circuit provides an overheat shutdown function for controlling the thermal FET (power device) to be forcibly turned OFF when the junction temperature of the thermal FET rises to a predetermined temperature or higher. When the temperature sensor detects that the power device has a predetermined or higher temperature increase, the detection information is maintained in the latch circuit, the overheat shutdown FET of a gate shutdown circuit is turned ON, and the power device is controlled to be forcibly turned OFF.

However, a shunt resistor is connected in series to a power supply path in order to detect a current. In recent years, there is a problem that the thermal loss of the shunt resistor due to a large load current cannot be ignored.

In addition, the above described overheat shutdown function and the gate shutdown circuit functions when a substantially complete short-circuit state is generated by a load, and a large current flows. However, the overheat shutdown function does not operate in the case of a small short-circuit current, such as so called layer short, which includes an incomplete short circuit having a small degree of short-circuit resistance.

A current may be monitored, and an over-current is detected by means of a microcomputer, whereby the thermal FET can be controlled so as to be turned OFF. However, the microcomputer control may have problems in responding to such over-current.

In addition, a shunt resistor, A/D converter, and a microcomputer and the like are required. Thus, a large package space is required. Moreover, there is a problem that the equipment cost is increased by these comparatively expensive elements.

In the case where a lamp (such as a headlight) load is the load, when a voltage is applied to the lamp load, a rush or initial current flows that is about 10 times as large as than when the lamp load has been in use for a period of time. Conventionally, when a current is detected without being limited to the above method, the rush current is masked, and is not detected. In the case where the lamp load or the like is used, the rush current is masked, and is not detected. Thus, the detection of over-current is delayed, and the switching device or wire has been excessively heated.

SUMMARY OF THE INVENTION

It is an object of the present invention to provide a semiconductor switching device capable of detecting an over-current, even with a rush current flow, the semiconductor switching device and high speed shut down of an over-current, such as an incomplete short-current.

In order to achieve the foregoing object, according to a feature of the present invention, there is provided a semiconductor switching device including a multi-source FET including a main electric field effect transistor (FET) and a reference FET;

a reference current setting circuit for feeding a reference current including a constant component current and a transient component current to the reference FET such that a source potential of the main FET is not lower than that of the reference FET when a load current flowing to a main FET is not within the range of an over-current containing a transient component;

a voltage comparator for detecting that the source potential of the main FET is lower than that of the reference FET;

a counter for counting the number of variations of the reference voltage to a predetermined number of vibrations; and a gate driving circuit for turning OFF the main FET by counting the counter. This makes it possible to shut down a current without the presence or absence of a transient component if a current exceeding a normal range flows a current on the load side.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF THE SEVERAL VIEWS OF THE DRAWINGS

FIG. 3 shows the waveforms of VSA, n×Iref, and ID with respect to a 200 ms timer signal, FIG. 4 shows the waveforms of VSA, n×Iref, and ID with respect to a 20 ms timer signal, FIG. 5 shows the waveforms of VSA, n×Iref, and ID when a switch SW1 is turned ON, and FIG. 6 shows a time axis that is 10 times as large as when compared with FIG. 5;

FIG. 10 shows the case where the shutdown function of FIG. 9 works with respect to the waveforms of a voltage at point A (dummy voltage) and VSA by further enlarging the time axis by 5 times as compared with FIG. 9;

FIG. 14 shows the waveforms of VSA, n×Iref, and ID with respect to a 20 ms timer signal, FIG. 15 shows the waveforms of VSA, n×Iref, and ID when a switch SW1 is turned ON, FIG. 16 shows the time axis is displayed by being enlarged to 10 times as compared with FIG. 15, and FIG. 17 shows the waveforms of VSA, n×Iref and ID with respect to a 200 ms timer signal;

FIG. 22 shows the case where the switch SW of FIG. 21 is turned ON by enlarging the time axis by 5,000 times as compared with FIG. 21, and FIG. 23 shows the case where the shutdown function of FIG. 21 works by enlarging the time axis by 5,000 times as compared with FIG. 21;

DETAILED DESCRIPTION OF THE EMBODIMENTS

Figure 1:
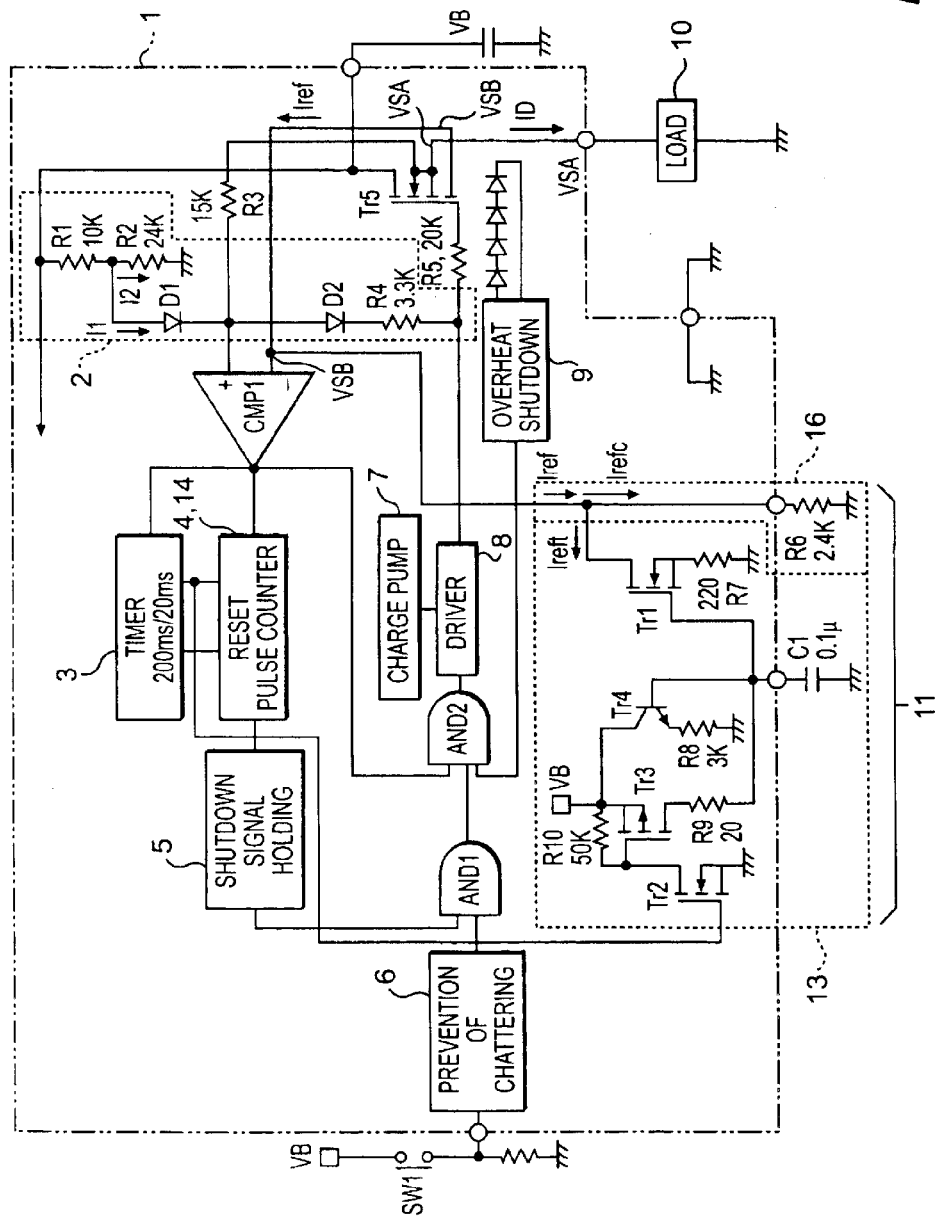
FIG. 1 is a block diagram showing a semiconductor switching device with a current vibration type shutdown function according to the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

FIG. 1 is a block diagram showing a semiconductor switching device 1 with a current vibration shutdown function according to the present invention.

A semiconductor switching device 1 has a multi-source FET (Tr5) including a main electric field effect transistor (FET) (QA) and a reference FET (QB).

The device 1 has a reference current setting circuit 11. The circuit 11 feeds a reference current Iref including a constant component current Irefc and a transient component current Ireft to the reference FET (QB) such that a source potential VSA of a main FET (QA) is not lower than a source potential VSB of the reference FET (QB) when a load current ID flowing to the main FET (QA) is not within the range of an over-current including the transient component.

The device 1 has a voltage comparator CMP1 for detecting that VSA is lower than VSB.

The device 1 has counters (4, 14) for counting the number of vibrations of the reference current (Iref) with respect to a predetermined number of vibrations by detecting that the voltage comparator (CMP1) is low.

The device 1 has a gate driving circuit (8) for turning OFF the main FET (QA) by counting, based on the counter. Thus, it is possible to shutdown a current irrespective of whether a transient component is present or absent when a current exceeding a normal range flows to a current ID on a load side.

Moreover, in the device 1, as long as a load current is within the normal range, the voltage comparator (CMP1) detects that VSA is not lower than VSB, whereby the gate driving circuit (8) turns ON the main FET (QA) and the reference FET (QB).

In the device 1, a reference current (Iref) vibration method includes several operating patterns. First, the feeding of a transient component current (Ireft) is repeatedly started, whereby the reference current (Iref) vibrates.

Moreover, the starting time intervals are a third predetermined time or less.

In the case where only the constant component circuit 16 operates or in the case where the constant component circuit 16 and transient component circuit 13 operate, when the source potential VSA of the main FET (QA) is lower than the source potential VSB of the reference FET (QB), a phenomenon that a transient component circuit 13 is restarted may occur. If the transient component circuit 13 is restarted again within a third predetermined time after the restart is repeated a predetermined number of times, the main FET (QA) is shut down. The third predetermined time is set as the time capable of detecting the next generated over-current which starts when and after the last over-current has been detected while the number of over-current detections is counted. That is, if an over-current is detected within the third predetermined time, the number of times the over-current is detected is integrated. However, if an over-current is not detected after the third predetermined time has elapsed, the number of times of detection is cancelled. This is because only a continuously generated over-current is targeted for detection. If the starting of the transient component is disabled within the third predetermined time, a problem occurs when this device is used as a fuse on the upstream side of a plurality of loads. That is, when a first load is turned ON, whereby the transient component starts, and then, when the transient component current decreases, if a second load starts within the third predetermined time, a transient component Ireft of a reference is reduced. Thus, there is a possibility that the source potential VSA of the main FET is lower than the source potential VSB of the reference FET. In addition, the starting of the reference transient component Ireft is restricted. Thus, the main FET (QA) is shut down at that time. A problem occurs when two loads are turned ON with a time difference equal to or less than the third predetermined time, and therefore, this restart within the third predetermined time is effective as a solution to the above problem.

The transient component current Ireft may be a constant current, and may be a current having a waveform analogous to the transient component of a load current ID. After elapse of a fourth predetermined time, the transient component current Ireft of the reference FET is eliminated, and only the constant component Irefc is present. At this time, the transient component current may flow to the load 10 side. At this time, the transient component Ireft of the reference restarts, and thus, the FET (QA) is never shut down. In the case where the fourth predetermined time is shorter than a transient component continuation time at the load 10 side, a reference transient component circuit 13 will start a plurality of times. As long as the start count for the transient component Ireft for FET (QA) shutdown is set to be greater than this plurality of times, the FET (QA) is never shut down due to a transient current component of a normal load. A protection function for shutting down the FET (QA) can be achieved only if an over-current occurs.

In addition, in the device 1, a reference current Iref vibration method includes the following operation patterns. The main FET (QA) and the reference FET (QB) repeat ON/OFF operations, whereby the reference current Iref vibrates. The counter 4 counts the number of times vibration occurs within the second predetermined time or less. In the case where a predetermined number of vibrations is not counted within the second predetermined time, it can be assumed that the load current ID has been released from an over-current state.

Moreover, the ON/OFF operation is repeated as follows.

First, the voltage comparator CMP1 detects that the source potential VSA of the main FET is lower than the source potential VSB of the reference FET, whereby the gate driving circuit 8 turns OFF the main FET (QA) and reference FET (QB).

A dummy voltage setting circuit 2 sets a first potential (potential at point A) that is lower than VSA.

The voltage comparator CMP1 detects that the decreasing VSB is lower than the first potential, whereby the gate driving circuit 8 turns ON QA and QB.

The dummy voltage setting circuit 2 sets a second potential (potential at point B) that is greater than the first potential (potential at point A).

The voltage comparator CMP1 detects that the increasing VSB is greater than the second potential and is greater than VSA, whereby the gate driving circuit 8 turns OFF QA and QB.

From these facts, as long as VSA is lower than VSB, the ON/OFF operation can be continued.

A reference current setting circuit 11 comprises a constant component circuit 16 for feeding a constant component current Irefc and a transient component circuit 13 for feeding a transient component current Ireft. In the case where VSA is equal to VSB, a value obtained by dividing a load current ID that flows to QA by a reference current Iref is defined as "n". A constant component current Irefc is greater than a value obtained by dividing a current value in a constant state when the load current ID is not within the range of an over-current by "n". The transient component current Ireft is greater than a value obtained by dividing a current value of a transient component in a transient state when the load current ID is not within the range of an over-current by "n". Therefore, a current indicating an upper limit (within a normal range) which is not within the range of an over-current can be fed to QB transiently.

In addition, the constant component circuit 16 can be composed of a resistor R6 or a constant current circuit. The constant component circuit 16 can be formed by using the resistor R6. In addition, a constant current Irefc can be fed constantly by using the constant current circuit.

The constant component circuit 16 feeds the constant component current Irefc when the load current ID flows. Thus, when QA is turned ON, QB is set to an ON state, making it possible to detect a current.

The transient component current Ireft is first fed within a first predetermined time and at a constant current value. Next, within a second predetermined time after the elapse of the first predetermined time, the above current is decreased within a range so that VSB does not exceed VSA, and is set to almost zero. This decrease is achieved by a time constant determined by electric discharge characteristics in which the charge accumulated in a capacitor C1 is discharged via a resistor R8. Thus, current indicating an upper limit within the normal range can be supplied constantly while its deviation is reduced.

The voltage comparator CMP1 detects that VSA is lower than VSB, whereby the transient component circuit 13 starts feeding the transient component current Ireft. However, restarting is not affected within the second predetermined time. Thus, the second predetermined time can be acquired as the time from over-current detection to judgment of whether or not a current is finally shut down.

A predetermined count in the first predetermined time is less than that of the second predetermined time. This makes it possible to detect an over-current in two patterns within the predetermined first and second time. Within the first predetermined time, a large over-current can be detected within a short time. With the second predetermined time, the over-current is detected for a long time, thus making it possible to precisely detect a small over-current.

The semiconductor switching device 1 operates while the device is connected between a power source VB for supplying an output voltage VB and a load 10. In addition, the device 1 is connected to the resistor 6 and capacitor C1, whereby the device 1 functions as described below. The resistor 6 and capacitor C1 are provided externally on the device 1 so that the resistance value and capacitance value can be changed according to the load 10. A switch SW 1 is also led externally of the device 1 so as to enable remote operation of the device 1. The switch SW1 is connected, whereby the device 1 has the functions described below. A region indicated by the dotted line of the device 1 shown in FIG. 1 indicates a region in which integration can be affected.

However, the device 1 uses a multi-source electric field effect transistor (FET) Tr5 as a main device (power device) in the circuit 1. Although the multi-source FET (Tr5) provides, an overheat shutdown circuit 9 in the vicinity of the FET, this overheat shutdown circuit 9 is not essential in the case where a constant current is fed, as is understandable from a description given later. The multi-source FET (Tr5) comprises a main FET (QA) and a reference FET (QB), wherein gate electrodes of QA and QB are connected to each other, and their drain electrodes are connected to a power source VB. The QA source electrode is connected to a "+" input terminal of the comparator CMP1, and the QB source electrode is connected to a "−" input terminal of the comparator CMP 1.

For this multi-source FET (Tr5), for example, a power MOSFET with a DMOS structure, a VMOS structure, or a UMOS structure, a MOSSIT with a structure analogous to these structures instead of the FET can be used. In addition, a MOS composite type device such as EST and MCT, or another insulation gate type power device such as IGBT can be used. Further, if a gate is used as a reverse bias, a junction type FET, a junction type SIT, SI thyrister and the like can be used. Transistor Tr5 may be a "n" channel type or "p" channel type.

The semiconductor switching device 1 comprises: at least a multi-source FET (Tr5); a comparator means (CMP1) for comparing voltages of the QA and QB source electrodes with each other; and a driver 8 for supplying a control voltage to a gate electrode of Tr5 according to an output of the comparator means (CMP1).

For the QA, for example, a power device with a multiple channel structure in which a plurality of unit cells are connected in parallel may be employed. QB is positioned adjacent to QA so as to be connected in parallel to the QA. QB is positioned adjacent to QA in the same process, so that a deviation in electrical characteristics caused by an effect of non-uniformity between a temperature drift and a lot can be eliminated. The number of unit cells connected in parallel, each of which configures QB, is adjusted so that the QB current capacity is smaller than the QA current capacity. For example, the number of QA unit cells is configured to be 1,000 with respect to one QB unit cell, whereby a ratio in channel width W between QB and QA is defined as 1:1,000. This ratio is equal to a ratio between a current flowing QB and a current flowing QA in the case where the QA source potential is equal to the QB source potential. In this way, the current flowing QB can be reduced.

In addition, a diode connected to the overheat shutdown circuit 9 functions as a temperature sensor. This diode is formed by a polysilicon thin-film deposited at the upper part of an inter-layered insulation film formed at the upper part of QB and QA, and a plurality of diodes are connected in series. As the temperature of QA rises, an overheat is detected by a voltage fall at both ends of a plurality of diodes connected in series.

More specifically, the semiconductor switching device 1 with its current vibration type shutdown function includes a dummy voltage setting circuit 2 for controlling the voltage of "+" input terminal (dummy voltage) of CMP 1; a pulse counters 4, 14 for counting the number of times from H to L of an output signal of CMP1; a timer 3 for specifying the count times of the counters 4, 14; a shutdown signal holding circuit 5 for holding a shutdown signal output after a predetermined number of times has been counted by the counters 4, 14; a chattering prevention circuit 6 for preventing chattering of an external input signal that is an ON signal of the switch SW1. The semiconductor switching device 1 further includes a driver 8 having a source transistor having a collector side connected to a potential VP and a sink transistor having an emitter side connected to a grounding potential (GND), the source transistor and the sink transistor being connected in series, for controlling the source transistor and the sink transistor to be turned ON/OFF based on a switch signal or the like caused by turning ON/OFF switch SW1, and outputting a control signal to a gate electrode of Tr5; a charge pump 7 for increasing pressure to a potential VP; and a reference current (Iref) setting circuit 11 for generating a transient current component of a reference current Iref for judging whether or not a rush current generated at a lamp load is an over-current. The switching device 1 is mounted in a monothilic manner on the same semiconductor substrate (semiconductor chip). The resistor R6 and capacitor C1 are provided externally of the chip. By externally providing these elements, the respective resistance value and capacitance value can be easily changed, and the waveform of a reference current can be traced with respect to the waveform of such rush current.

Next, a current vibration type shutdown function of the semiconductor device 1 according to the present invention will be described with reference to the flow charts shown in FIGS. 24 to 26. The device 1, vibrates a current, thereby detecting an over-current and shutting down the over-current. Hereinafter, a method of detecting and shutting down the over-current will be described.

Figure 24:
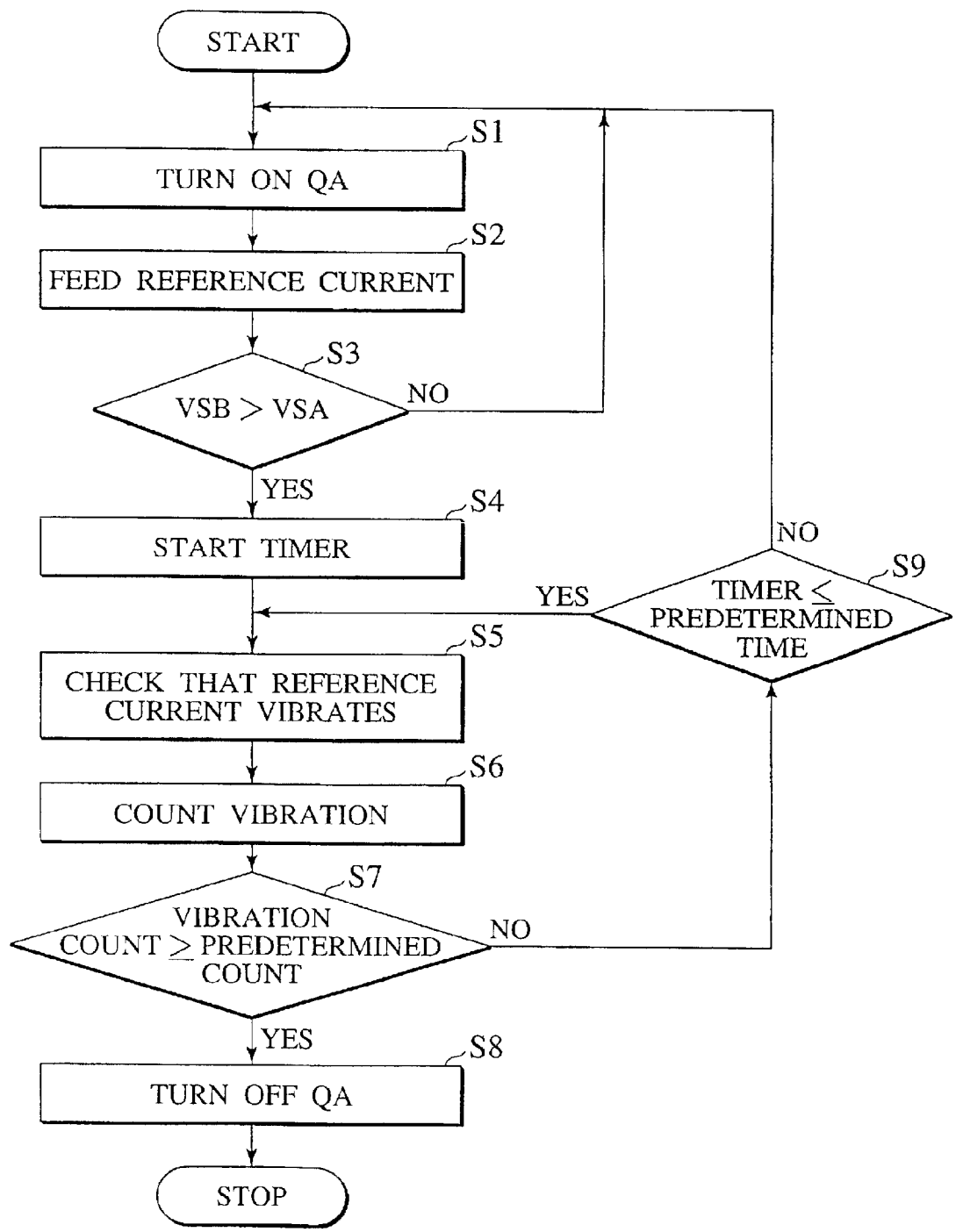
FIG. 24 is a flow chart of a current vibration type shutdown function of a semiconductor switching device 1 according to the present invention.

First, in order to perform the basic function of switching of the device 1, as shown in step S1 of FIG. 24, a driver 8 turns ON a main FET (QA). Then, a load current ID will flow. Next, as shown in step S2, in a reference current circuit 11, a reference current Iref including a constant component current Irefc and a transient component current Ireft is fed to QB so that the QA source potential VSA, when the ID flowing to QA is not within the range of an over-current including a transient component current, is not lower than the source potential VSB of the reference FET (QB).

At step S3, the voltage comparator (CMP1) detects the generation of an over-current based on the fact that VSA is lower than VSB. On the other hand, it is assumed that an over-current is not generated, processing reverts to step S1.

In the case where an over-current is generated, the timer 3 is started in step S4.

At step S5, the reference current Iref vibrates. During vibration, an over-current is generated.

At step S6, the counters 4, 14 count the vibration count of the reference circuit in step S5. Thus, a time when an over-current is generated is indirectly measured.

At step S7, the counters 4, 14 judge whether or not the number of times of vibration reaches a predetermined number. If it reaches the predetermined number, it is assumed that an over-current flows continuously for at least a predetermined time. That is, it is judged that this over-current is not temporary. At step S8, the driver 8 turns OFF QA.

If the count does not reach the predetermined number, it is judged whether or not the timer 3 has reached a predetermined time in step S9. If the timer 3 does not reach the predetermined time, processing reverts to step S5 and the number of vibrations are counted. If the timer 3 reaches the predetermined time, it is judged that the detected over-current is temporary. At this time, QA is not shut down. Then, processing reverts to step S1 and the next over-current detection is ready.

Moreover, the vibration in step S5 may be directed to repeatedly start feeding of the transient component current Ireft. The starting time intervals are equal to or less than a third predetermined time. Based on this fact, it may be judged that an over-current continues.

In addition, the vibration in step S5 may be directed to QA and QB for repeating the ON/OFF operation.

Figure 25:
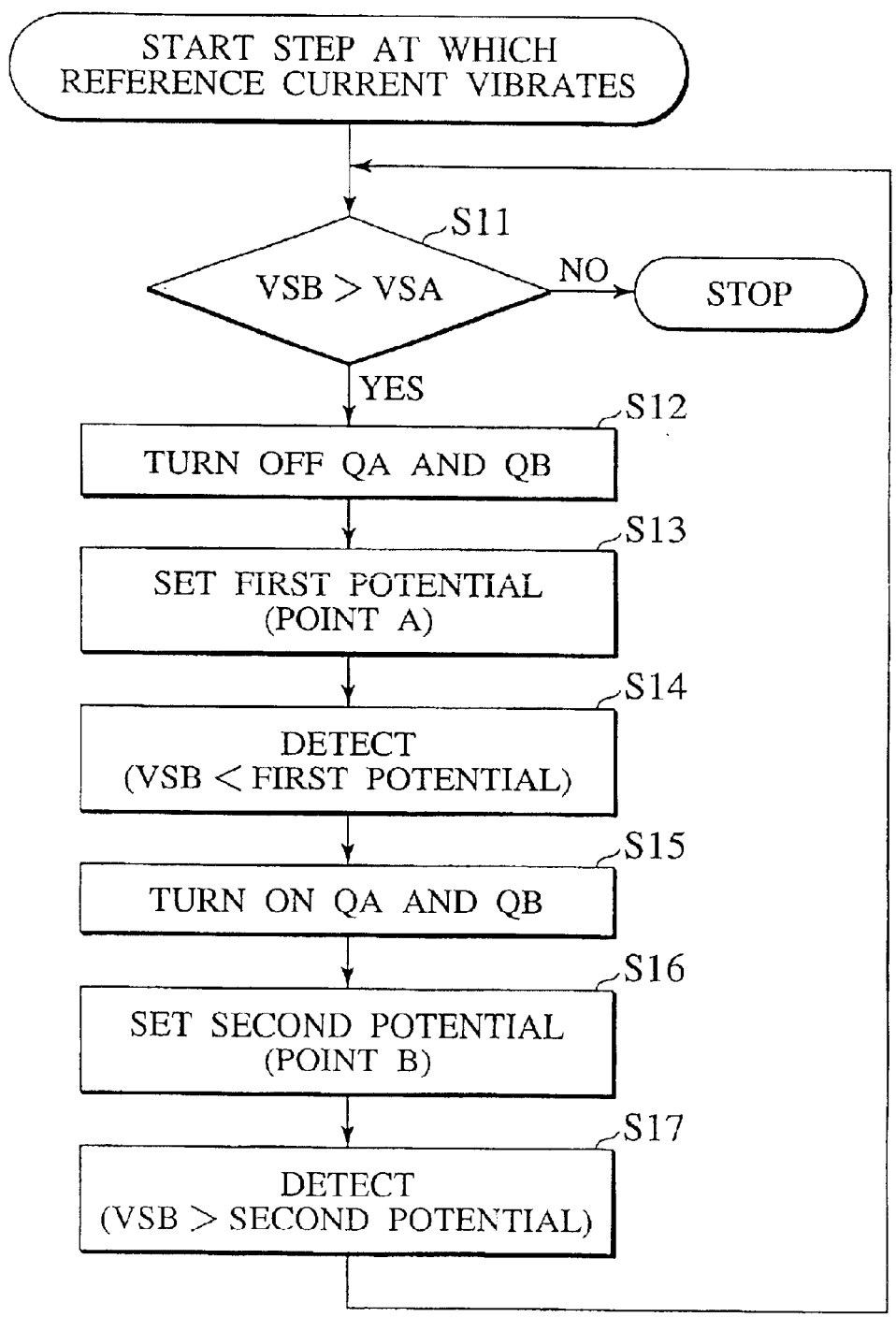
FIG. 25 is a flow chart of the steps at which a reference current vibrates.
Figure 26:
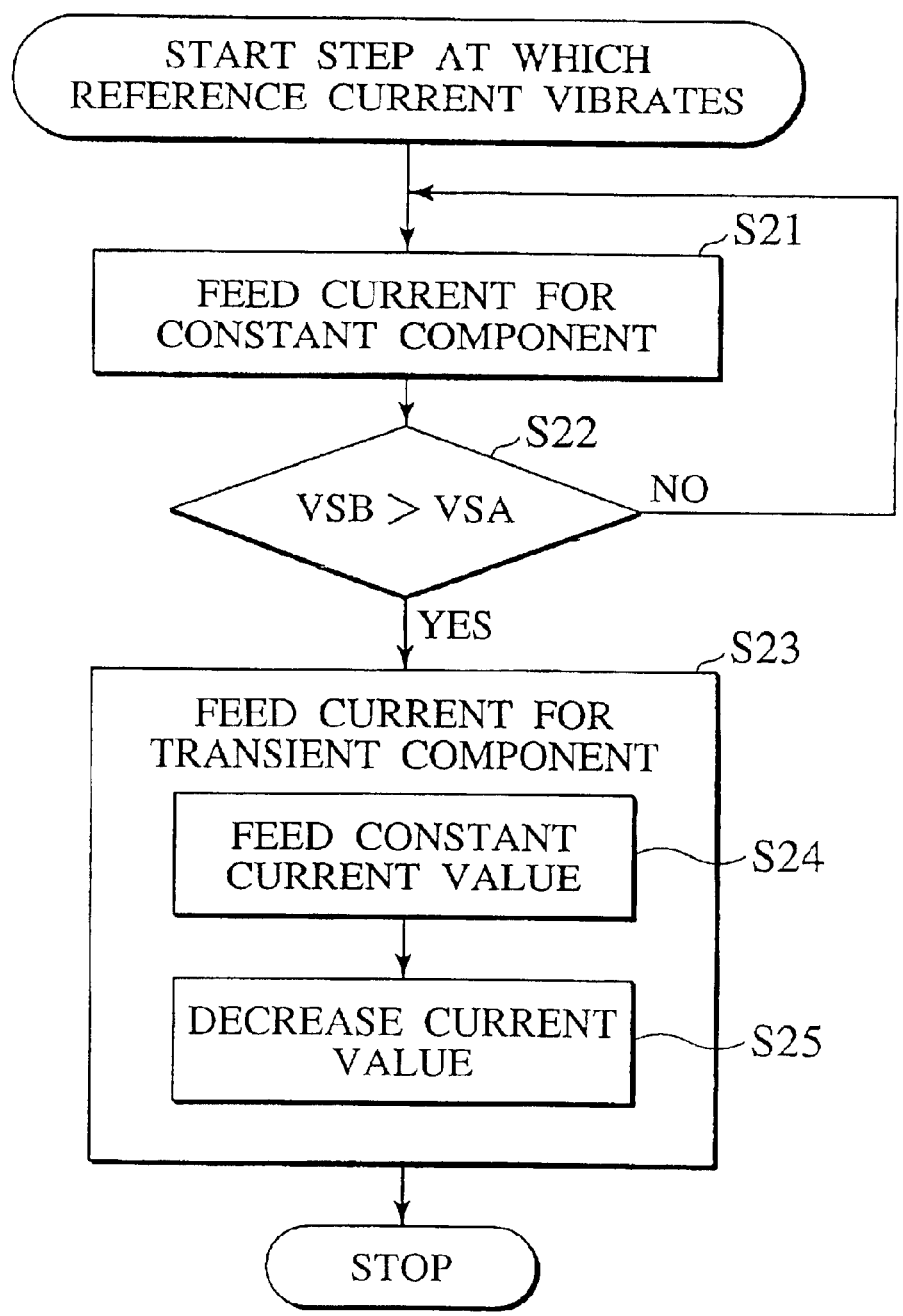
FIG. 26 is a flow chart of the steps of feeding a reference current.

Repeating of the ON/OFF operation by QA and QB is affected according to the flow chart shown in FIG. 25.

First, similar to step S3 shown in FIG. 24, in step S11, the voltage comparator (CMP1) detects the generation of an over-current by the fact that VSA is lower than VSB. Otherwise, it is assumed that an over-current is not generated. Then, this repetition of the ON/OFF operation is stopped.

By detecting the generation of an over-current, the driver 8 turns OFF QA and QB in step S12.

At step S13, the dummy voltage setting circuit 2 sets a first (point A) voltage that is lower than VSA.

At step S14, the CMP1 detects that falling VSB is lower than the first potential (potential at point A).

At step S15, the driver 8 turns ON QA and QB.

At step S16, the dummy voltage setting circuit 2 sets a second potential (potential at point B) at which the rising VSB is greater than the first (point A) potential.

At step S17, it is detected that VSB is greater than a second potential (potential at point B). Then, processing reverts to step S11.

Next, step S2 shown in FIG. 24 will be described in detail with reference to FIG. 26.

First, in step S21, the constant component circuit 16 feeds a constant component current Irefc upon flow of a load current ID.

At step S22, the CMP1 detects the generation of an over-current by the fact that VSA is lower than VSB. On the other hand, it is assumed that an over-current is not generated, processing reverts to step S21.

When the over-current is generated, the transient component circuit 13 feeds the transient component current Ireft in step S23.

Moreover, following step S23, in step S24, the transient component current Ireft is first fed for a first predetermined time at a constant current value. Next, in step S25, the transient component current Ireft is decreased within the range so that VSB does not exceed VSA in normal state, within the second predetermined time after the elapse of the first predetermined time, and is set to almost zero.

(First Semiconductor Switching Device 1)

Figure 2:
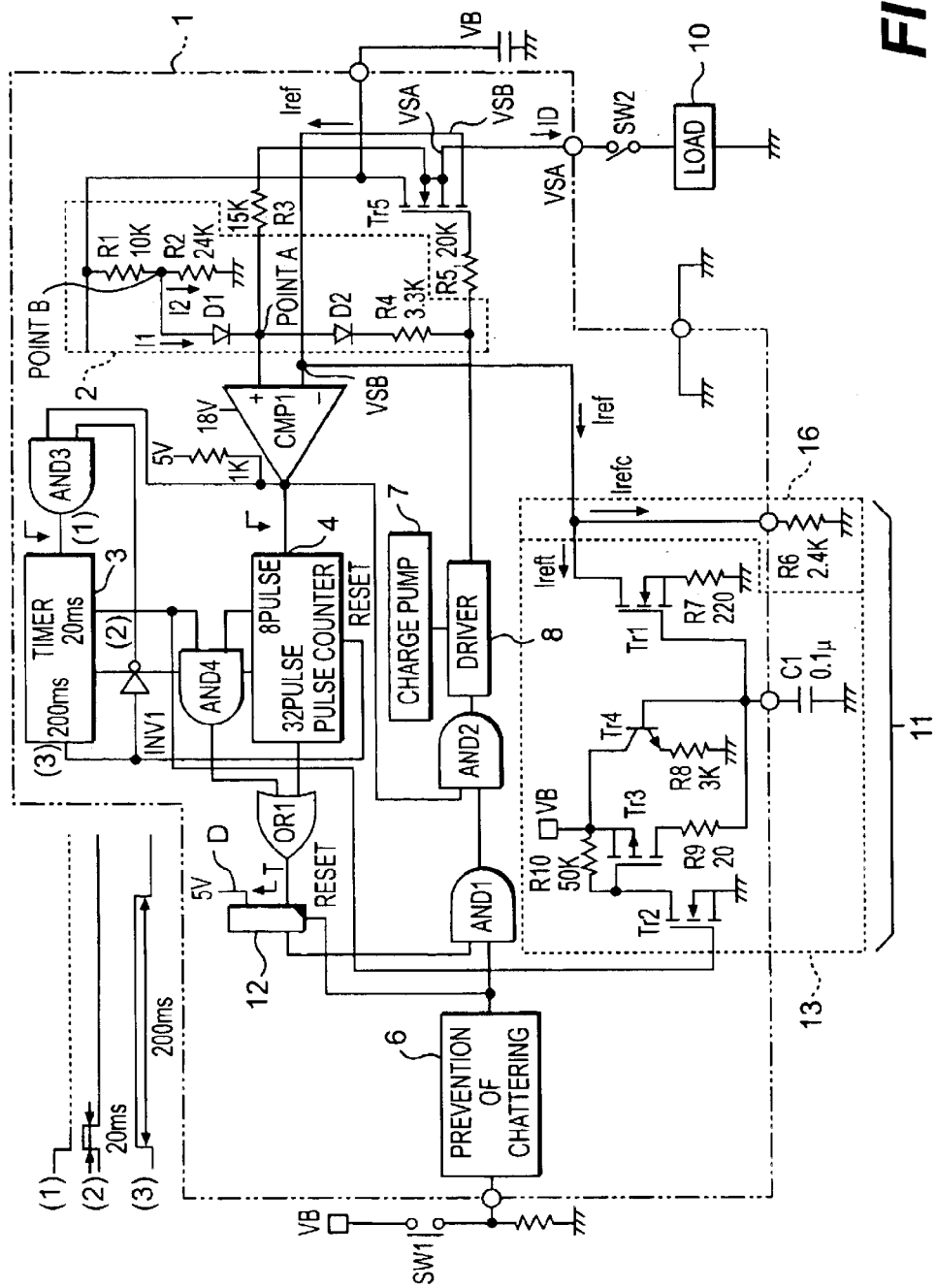
FIG. 2 is a circuit configuration diagram showing a first semiconductor switching device with a current vibration type shutdown function.

More specifically, a semiconductor switching device 1 with a first current vibration type shutdown function is composed of circuits as shown in FIG. 2.

A dummy voltage setting circuit 2 includes resistors R1, R2, and R4 and diodes D1 and D2. A numeral assigned to the resistor R1 or the like represents a resistance value in units of Ω. Similarly, a numeral assigned to a capacitor C1 represents a capacity value in units of F.

Two timers for measuring 20 milliseconds and 200 milliseconds start at the same time when a start signal is inputted to an input terminal 1 in the timer 3. A level H is output until 20 milliseconds have been measured from the start in the output terminal 2. A level H is output until 200 milliseconds have been measured from the start in the output terminal 3. An output from the terminal 3 is inverted by means of an inverter INV1, and is input to an input terminal of AND3.

The counter is cleared when a signal is input to a reset terminal in the counter 4. The counter counts the number of H to L signals to be input to an input terminal connected to the CMP1, and outputs the level H from a 8-pulse output terminal when the number of times is 8. In addition, when the number of times is 32, the level H is output from a 32-pulse output terminal.

A shutdown signal holding circuit 5 has a D flip-flop 12. A terminal D is connected to the level H. When an OR circuit inputs a level H to a terminal T, even when the level H disappears, the level L is continuously output from an output terminal until a reset signal has been input to a reset terminal.

A reference current (Iref) setting circuit 11 includes transistors Tr1 to Tr4, resistors R7 to R10, and a capacitor C1.

A switch SW1 is provided externally to the semiconductor chip. A switch SW2 may be further provided. This switching device 1 with the first current vibration type shutdown function is operated by a user and the like turning ON the switch SW1. In the case where the switch SW2 is provided, this device is operated by turning ON the switches SW1 and SW2. An output voltage VB of a power source VB is set to 12.5V, for example, and an output voltage VP of a charge pump 7 is set to VB+10V, for example. A resistor R6, which is a so called constant component Rrc of a reference resistance Rr, is connected to the QB source electrode. The resistance value of the reference resistor Rrc may be selected according to a ratio "n" of channel widths "W" between QB and QA. For example, as described above, in the case where the ratio "n" of channel widths W between QB and QA is defined as 1:1,000, a value less than a value obtained by multiplying a load resistance value by the ratio "n" (1,000) may be set. Further, in order to finely adjust the resistance value of a reference resistance Rrc, it is utilized that the fact that, in the case where the source potential VSA of a main FET (QA) is equal to the source potential VSB of a reference FET (CB), a value obtained by dividing the current (ID) flowing in the main FET (QA) by the current (Iref) flowing in the reference FET (QB) is defined as a ratio "n". In this case, an attempt is made to feed a current greater than the value obtained by dividing the current value in the constant state of the load (10) by "n". Thus, the resistance value of the reference resistor Rrc is decreased so that VSB is smaller than VSA. By setting this reference resistor Rrc, the drain-source voltage of QA is equal to that of QB when an over-current exceeding a load current during normal operation flows through QA.

The first semiconductor switching device 1 comprises: transistor Tr5 of a multi-source FET including a main electric field effect transistor (FET: QA) and a reference FET (QB); a voltage comparator CMP1 for comparing the relationship in scale between a QA source potential VSA and a QB source potential VSB; and a driver 8 being a gate driving circuit, when the QA source potential VSA is greater than the QB source potential VSB, for applying a drive voltage to the gate of Tr5, and when the QA source potential VSA is smaller than the QB source potential VSB, shutting down the drive voltage with respect to the gate of Tr5. When the current ID at the load 10 side is within a normal range including the transient component, a reference current (Iref) setting circuit 11 for controlling the QB current Iref so that the QB source potential VSB does not exceed the QA source potential VSA, is disposed between the QB source and grounding.

In the reference current (Iref) setting circuit 11, in the case where the QA source potential VSA is equal to the QB source potential VSB, when a value obtained by dividing the current ID by the current Iref is defined as "n", a constant component (Irefc) circuit flowing a current greater than the value obtained by dividing by "n" the value of the current ID in the constant state of the load 10 and a transient component (Ireft) circuit flowing a current greater than the value obtained by dividing by "n" the value of the current ID in the transient state of the load 10 are disposed in parallel between the QB source and grounding.

Next, the operation of a semiconductor switching device 1 with a first current vibration type shutdown function according to the present invention will be described. When VSA=VSB, a relationship is established as ID (QA drain current)=n×Iref, RL×n=Rr, where VSA denotes a QA source potential; VSB denotes a QB source potential; ID denotes a QA drain current; "n" denotes a current sensing ratio; Iref denotes a QB drain current; RL denotes the resistance (value) of a load connected between QA and GND; Rr denotes the resistance (value) of a reference connected between QB and GND.

Therefore, if VSA>VSB, a relationship is established as ID<n×Iref and RL×n>Rr. If VSA<VSB, a relationship is established as ID>n×Iref and RL×n<Rr. Thus, If Iref or Rr is set as a reference value, it can be judged whether or not a load current value or a load resistance value is greater or smaller than a reference value based on a relationship in scale between VSA and VSB.

When Iref or Rr is set to a value that corresponds to an over-current or an overload, if VSB<VSA, it can be judged as a normal state, and if VSB>VSA, it can be judged as an over-current or overload state. When it is judged as the over-current or overload state, QA and QB are turned OFF. That is, a charge pump voltage Vp applied to the QA and QB gates is shut down via a gate serial resistance, and the QA and QB gates are grounded via a gate serial resistance.

A load current ID or load resistance RL is not generally obtained as a constant value. These values including a component transiently generated like a rush or initial current immediately after a switch has been turned ON and a constant component in the subsequent stable state. The reference current Iref or reference resistance Rr is also set to a value obtained by combining a transient component and a constant component according to the load side. That is, Iref or Rr is not constant, and the values changed with an elapse of time (transiently). This makes it possible to achieve the following: (a) ID<n×Iref or RL×n>Rr can be set with respect to the value of ID or RL generated when the load side is normal; and (b) the difference between ID and n×Iref can always be reduced to a minimum.

A constant component (Irefc, Rrc) of Iref or Rr is made available by disposing of the resistor R6. If the constant component Irefc of the load current can be regarded as being independent of a voltage in the power voltage fluctuation range, the constant component (Irefc) circuit 16 is composed of a constant current circuit instead of the resistor R6.

On the other hand, the transient component (Ireft, Rrt) is made available by a transient component circuit 13 using Tr1 to Tr4, R7 to R10, and a capacitor C1 as shown in FIG. 2. Timing for the flow of a transient component Ireft is conducted in two ways: (c) a timing when the transient component Ireft is fed in synchronization with an input signal (ON) caused by the switch SW1; and (d) a timing when the transient component Ireft is fed due to a load fluctuation irrespective of the switch SW1.

A description of (c) can be easily understood. That is, a transient component circuit 13 is started by means of an ON signal of the switch SW1.

Next, a description of (d) will be given. In (d), SW2 is required at the downstream (load side) of QA. Assume that SW1 is turned ON, and SW2 is turned OFF. In this state, although QA and QB are turned ON, SW2 is turned OFF. Thus, a load current does not flow. On the other hand, Irefc always flows via R6. Thus, a relationship is established as Iref×n>ID (=0), and a relationship is established as VSA>VSB. Then, an output of CMP1 is set to H. The timer and the counter are designed to operate in an input fall cycle. In this state, therefore, the timer and the counter do not operate at all. The timer starts actuation when an input falls. The timer has the first output of which a level H is obtained for 20 milliseconds and the second output of which a level H is established for 200 milliseconds. The timer is designed so as to not accept an input for 200 milliseconds by means of a 200 ms output, INV1, and AND3 once it is actuated. When the timer output 20 ms is set to L, Tr and Tr3 (PMOS) are turned OFF. Then, a charge of the capacitor C1 is discharged based on a base current of Tr4, and a gate potential of Tr1 is set to zero potential. Then, Tr1 is turned OFF, and Iref is obtained as the only current Irefc that flows R6. When SW2 is turned ON in this state, a load current flows through a main FET (QA). If this load current is greater than Irefc×n, a relationship is established as VSA<VSB, and an output of CMP1 is changed from level H to level L. The timer and counter operate, and the timer output 20 ms is set to level H. When Tr is turned ON, and then, Tr3 is turned ON, a current flows via R9, and C1 is charged up to a voltage close to a power voltage VB. Then, a gate voltage of Tr1 is lifted up to a voltage close to the power voltage, and a transient component Ireft of Iref flows R7. Its scale is expressed by equation 1 below:

$$Ireft=(VB-Vth)/R7 \qquad \text{Equation 1}$$

where Vth denotes a threshold voltage of Tr1. While the timer output 20 ms is set to H, Tr2 and Tr3 are maintained to be in an ON state, and constant Ireft expressed by the above equation 1 and Irefc flow. At this time, when Ireft is set so as to be Iref×n=(Ireft+ Irefc)×n>ID (including transient component), a relationship is established as VSB<VSA. When the timer output 20 ms is set to L, Tr2 and Tr3 are turned OFF, and a charge from the capacitor C1 is discharged as a base current of an NPN transistor Tr4. A discharge time constant is expressed by equation 2 below, where a current amplification rate of Tr4 is defined as hfe4=200.

The discharge time constant when Tr1 gate potential decreases=
$$C1 \times R8 \times hfe4 = 0.1 \times 10^{-6} \times 3 \times 10^{3} \times 200 = 60 \text{ ms} \qquad \text{Equation 2}$$

As the gate potential of Tr1 decreases, Ireft decreases. It is required to disable timer reentry while Ireft decreases to almost zero, and therefore, a 200 ms timer is provided in FIG. 2. Although a constant component circuit is composed of a fixed resistor R6, a constant current circuit may be employed without being limited to the fixed resistor.

On the other hand, a transient component Ireft indicates a first predetermined time when the 20 ms timer is maintained to be in an ON state, a predetermined current value is expressed by equation 1. Then, this component decreases within the range so that the source potential VSB does not exceed the source potential VSA, and the 200 ms timer is set so as to be almost zero within the second predetermined time to maintain the ON state.

When Tr5 is turned ON, i.e., when the semiconductor switching device 1 is turned ON, the constant component circuit is always actuated, and the constant component Irefc flows continuously.

When VSA is lower than VSB, the transient component circuit is started, and the transient component Ireft is fed. Within the second predetermined time, in which the 200 ms time is maintained to be in an ON state, even when VSA is lower than VSB, the transient component circuit is not restarted.

Next, an operation of the device 1 containing a dummy voltage setting circuit 2 will be described. The dummy voltage setting circuit 2 includes resistors R1 to R4 and diodes D1 and D2. When QA is fully turned ON, VSA rises up to the power voltage VB, and the driver output of the gate driving circuit 8 rises up to Vp. D1 and D2 are reversely biased, and the dummy voltage setting circuit 2 is isolated from the peripheral circuit, and does not have any effect. However, once the CMP 1 has been set to L, when the gate driver 8 is turned OFF by AND2, R4 is grounded on GND via a sink transistor of the driver 8. Thus, a current flows through paths of power voltage VB→R1→point B→D1→point A→D2→R4→driver sink transistor→GND, and a potential at point A is lowered. At this time, the potential at point A is calculated under the condition such that no current through R3 is input and output. A circuit from R1 to R2 can be expressed by equation 3, and a circuit from R1 to R4 through points B and A can be expressed by equation 4.

$$10K(I1+I2)+24K \times I2=12.5(V) \quad \text{Equation 3}$$

$$10K(I1+I2)+3.3K \times I1+0.6 \times 2=12.5(V) \quad \text{Equation 4}$$

From equations 3 and 4, I1=0.736A and I2=0.151A are obtained. Therefore, the potential at point A is obtained as in equation 5. On the other hand, when I1=0, a potential at point B is obtained as in equation 6.

$$\text{(Potential at point A)}=3.03V \quad \text{Equation 5}$$

$$\text{(Potential at point B:I1=0)}=8.82V \quad \text{Equation 6}$$

In the circuit shown in FIG. 2, the potential at point A differs from the value shown in equation 5 because a current is input or output through a resistor R3. When the current flowing resistor R3 is set to zero, i.e., when the potential at point A=VSA, 3.03V is obtained. When the potential at point A is smaller than VSA, it is obtained according to equation 7 below.

$$\text{Potential at point } A=VSA-(R3 \text{ voltage fall}) \quad \text{Equation 7}$$

That is, once QA has been turned OFF, a potential lower than VSA is input to a +input terminal of CMP1. Therefore, even when VSA vibrates to some extent, if the vibration width is smaller than a R3 voltage fall, CMP1 is stabilized to maintain L. When QA is continuously turned OFF, VSA is lowered toward GND, and the QA gate potential is lowered. The QB gate is directly linked with the QA gate, and thus, VSB is lowered as VSA is lowered. As VSA is lowered, although the potential at point A is slightly lowered, its lowering quantity is slight.

On the other hand, VSB is continuously lowered together with the lowering of VSA. The potential at point A is supplied to the "+" terminal of CMP1 and the potential of VSB is supplied to the "−" terminal. Thus, a relationship is established as "+" terminal potential of CMP1>"−" terminal potential of CMP1, and an output of CMP1 is inverted from L to H. This inversion occurs irrespective of the state on the load side, i.e., even when VSA<VSB. In this manner, the gate driver is turned ON again, QA and QB are turned ON, and VSA and VSB start to rise. Since the gate driver output rises from 0V to Vp, D2 is reversely biased, and the potential at point A rises as VSA rises. At this time, a relationship is established as the potential at point A>VSA. This state continues until the potential at point A is equal to that at point B (potential obtained by pressure dividing the power voltage VB by R1 and R2). At this time, the potential at point B is equal to a voltage obtained by pressure dividing the power voltage VB by R1 and R2, and 8.82V is obtained from equation 6.

In short, the dummy voltage setting circuit 2 serves to forcibly turn ON QA and QB when VSA is obtained as a dummy voltage L (potential at point A) expressed by equation 5 or less, and maintain QA and QB to be ON irrespective of the state of the load side until VSA has been set to a dummy voltage H (potential at point B) or more expressed by equation 6. When VSB exceeds a value of equation 6, it is determined whether QA and QB are turned ON/OFF according to a relationship whether large or small between VSA and VSB.

When a timing of starting setting of a transient component (Ireft or Rrt) is executed according to the method of (d), this switching device 1 can be used instead of a fuse. In the case where the device is used instead of the fuse, SW1 is set ON. A load is controlled to be turned ON/OFF by SW2. That ON/OFF signal is not input to this switching device 1. Although it is required to start setting of a transient component (Ireft) when a load current (ID) changes, the system of (d) meets this requirement. In addition, even when this device is used as a general switching device so as to be turned ON/OFF by SW1, the setting of the transient component (Ireft) can be started without any problem.

On the other hand, when the timer output 20 ms is set to H, Ireft is set, and a relationship is established as VSA>VSB, the QA and QB that have been temporarily turned OFF are turned ON again by a dummy voltage L (potential at point A). Then, as long as a load circuit is normal, in other words, as long as a wiring short-circuit or the like does not occur, QA and QB continued to be ON.

In the dummy voltage setting circuit 2, after VSA is lower than VSB, when QA and QB are switched OFF, VSA is compared with VSB by using the potential at point A that falls into a lower dummy voltage level L instead of VSA. If VSB is lower than a dummy voltage level L, QA and QB are switched ON.

Until a potential at potential B has been obtained in equation 6 in which VSB rises, and a dummy voltage level H greater than the dummy voltage level L is obtained, QA and QB are maintained to be turned ON irrespective of the relationship in scale between VSA and VSB. When VSA exceeds the dummy voltage level H (potential at point B), VSA is compared with VSB. If VSA is smaller, QA and QB are switched OFF.

Therefore, as long as VSA is lower than VSB, ON/OFF operation is continued.

After QA and QB repeat the ON/OFF operation predetermined times, the multi-source FET (Tr5) is shut down. This shutdown is performed in two cases, i.e., in the case where eight ON/OFF operations are performed within a first predetermined time of the 20 ms timer and in the case where 320N/OFF operations are performed in a second predetermined time of the 200 ms timer.

While a 20 ms output of the timer 3 is set to H, in the case where an over-current state Irefxn<ID or an overload state Rr>RLxn is established, when the voltage comparator CMP1 repeats eight outputs of high/low (H/L), QA and QB are shut down. In the former case, a dead shorting state is established. In this case, the heating of QA due to the ON/OFF operation is large, and thus, QA and QB are shut down for a minimally short time. In the latter case, the over-current value is smaller than that of the former case, and the heating of QA is reduced. Thus thirty-two ON/OFF operations are performed for a thorough check. However, it is more preferable that thirty-two ON/OFF operations be reduced to eight ON/OFF operations, and the eight ON/OFF operations can be performed in any case.

(First Embodiment (According to First Semiconductor Switching Device 1))

Figure 3:
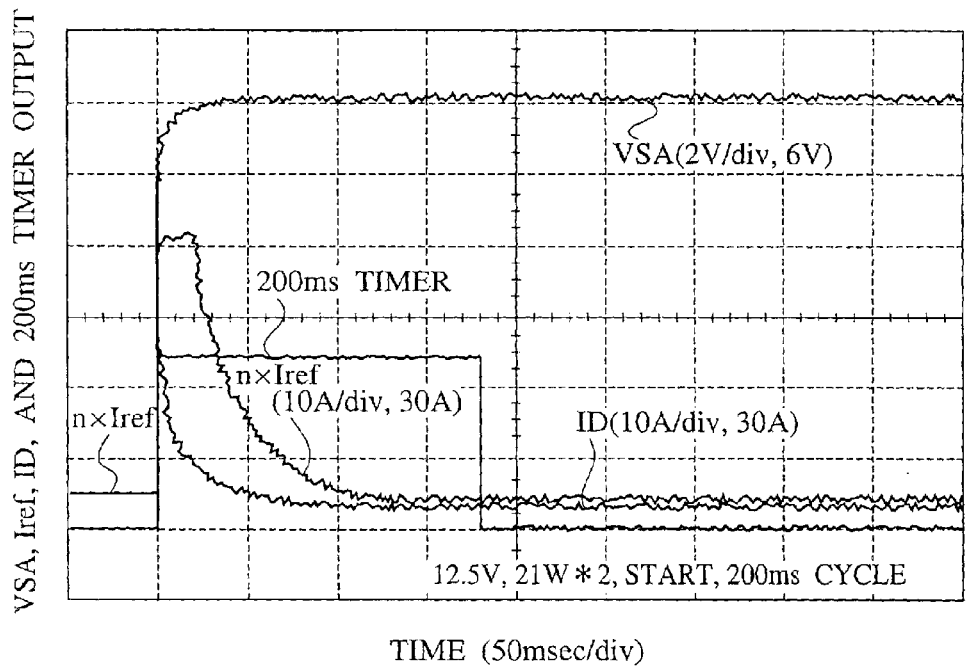
FIGS. 3 to 6 are signal waveform chart of a first semiconductor switching device with a current vibration type shutdown function in a first embodiment of the present invention (the normal use of a load), where

In the first embodiment, an operation of the first switching device 1 when a normal lamp load is used will be described here. A case in which a lamp does not function in a shutdown function, and continuously provides light is assumed. A lamp load 10 *is* employed as a load having two 21W bulbs connected in parallel. FIG. 3 is a graph showing signal waveforms of a switching circuit 1 when the bulbs light. A lime of 50 milliseconds per scale is shown on a horizontal axis. On a vertical axis, there is shown a source potential (VSA) of the main FET (QA) of Tr5; and a voltage representing a timer output of 200 milliseconds output at an output terminal 3 until 200 milliseconds have been measured from the start of the timer 3; QA drain current ID; and drain current Iref of the reference FET (QB) of Tr5 obtained by "n" times. The unit of the vertical axis is shown at the right side of a respective one of VSA, ID, and Iref in the graph. The VSA vertical axis is represented as (2V/div, 6V), one scale denotes 2V, and a voltage of the fourth scale of all the eight scales is defined as 6V. Similarly, the vertical axis of ID and nxIref is represented as (10A/div, 30A), and one scale is defined as 10A, and the current of the fourth scale of all the eight scales is defined as 30A. In the following graph as well, the vertical axis is represented by a similar measurement system.

A timer output is turned ON at the second scale of the time axis, and is turned OFF 180 milliseconds after the timer output has been turned ON. Current ID starts flowing at the same time as when the timer output has been turned ON. Although the starting current value reaches 30A, the value then decreases, and becomes constant at 4A before the timer output is turned OFF. The ID is a current that carries a lamp load, and the lamp lights when the current starts flowing. When the current value is obtained as 4A, the lamp normally lights continuously. This current 4A is obtained as an ID constant component, and a component is obtained as a transient component by subtracting a component of the current 4A from the current value that exceeds the current 4A when the current starts flowing. As nxIref, 5A of the constant component "nxIrefc" starts flowing at the same time when the timer output has been turned ON. Although this starting current value reaches 40A, the value then decreases, and the transient component nxIreft is eliminated before the timer output is turned OFF. Then, only 5A of the constant component nxIrefc becomes constant. The ID current value is smaller than nxIref at any time as well. Therefore, it can be judged that VSA is greater than VSB at any time as well, and an over-current is not generated. In VSA, a voltage increases at the same time as when the timer output is turned ON, and a voltage exceeding 12V is applied to the lamp load 10. When nxIref>ID, FET is continued to be turned ON.

Figure 4:
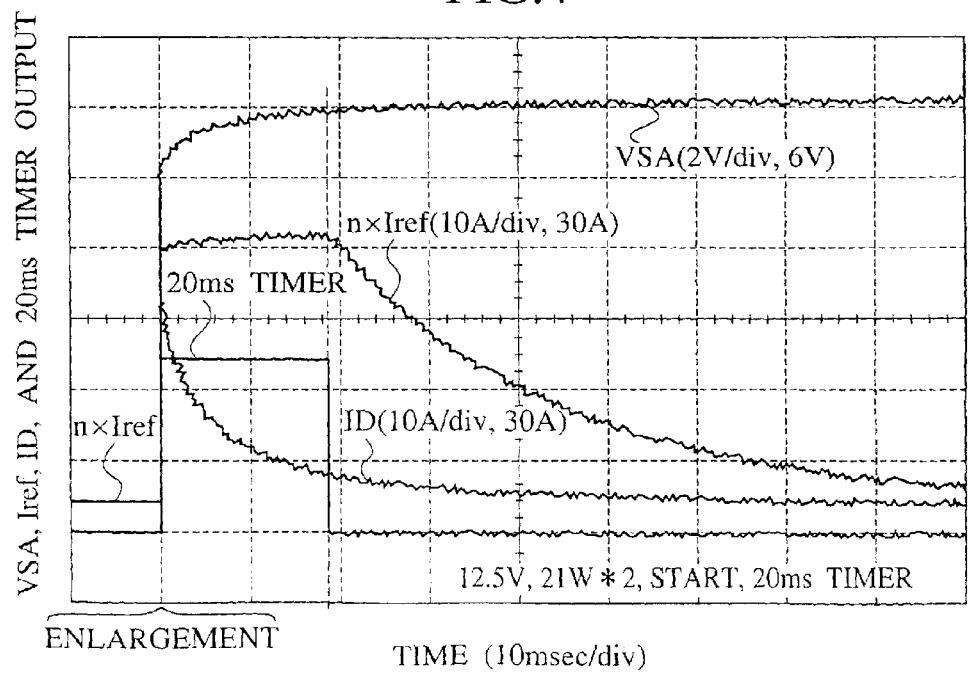

The waveforms of VSA, ID, and nxIref in FIG. 4 are identical to those shown in FIG. 3. The figure shows the relation with a 20 ms timer 3, and the time axis on the horizontal axis is enlarged to 5 times. From the foregoing, it is found that nxIref is fixed to about 40A until a signal of the 20 ms timer 3 is turned from ON to OFF, and the value decreases after the signal has been turned OFF.

Figure 5:
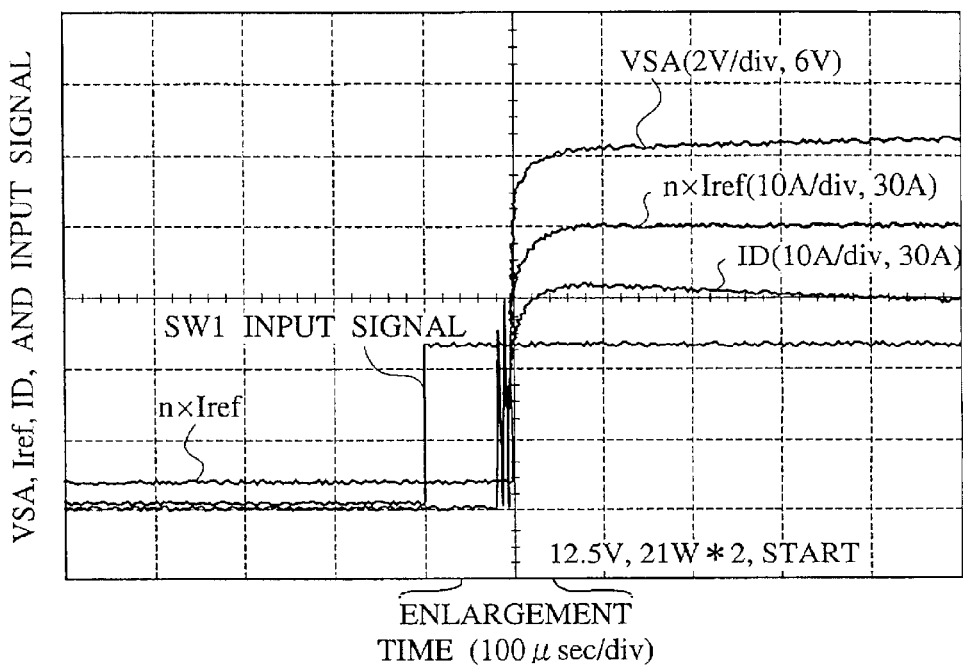

The waveforms of VSA, ID, and nxref in FIG. 5 are identical to those shown in FIGS. 3 and 4. The figure shows the relation with an ON signal of an input signal (gate driving signal) of a driver 8 caused by switch SW1 or the like generated when SW1 is turned ON, wherein the time axis of the horizontal axis shown in FIG. 5 is further enlarged to 100 times. Therefore, due to a rise delay of the charge pump 7, a delay of about 80 microseconds is produced from ON of the SW1 input signal (gate driving signal) to a rise of ID or the like.

Figure 6:
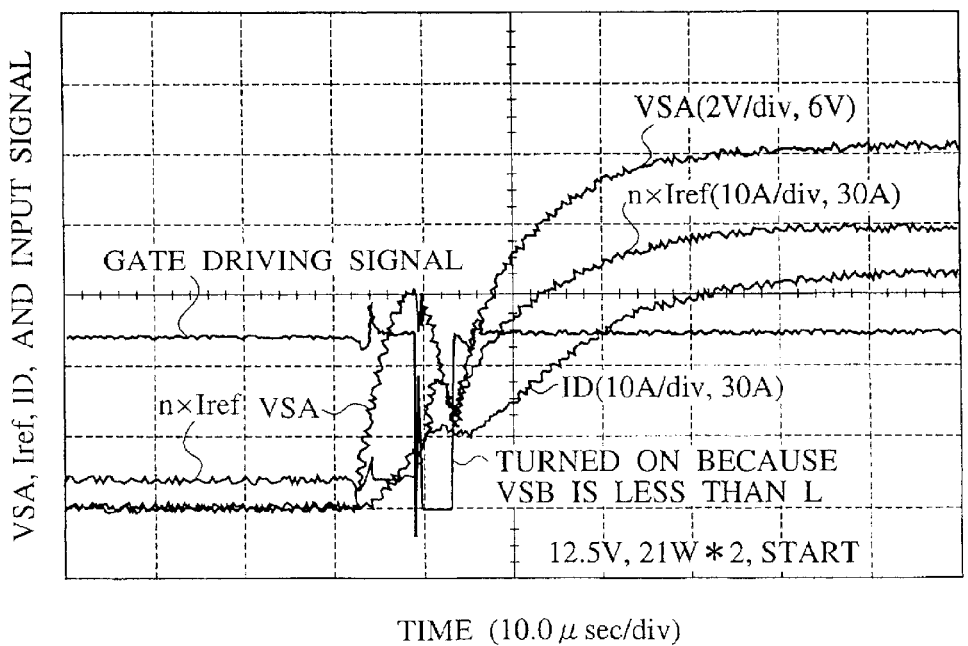

The waveforms of VSA, ID, nxref, and the gate driving signal in FIG. 6 are identical to those shown in FIG. 5. The rise time of the waveforms of VSA, ID, and nxIref shown in FIG. 6 is enlarged to 10 times that shown in FIG. 5. In this manner, current ID is greater than nxIref after the time of three scales and a half. By this reversal, the gate driving signal is turned OFF, and the increasing VSA decreases. Then, when VSA decreases, and VSB is equal to or less than L (potential at point A), an input signal is turned ON again, and VSA, ID, and nxIref rise.

(Second Embodiment (According to First Semiconductor Switching Device 1))

Figure 7:
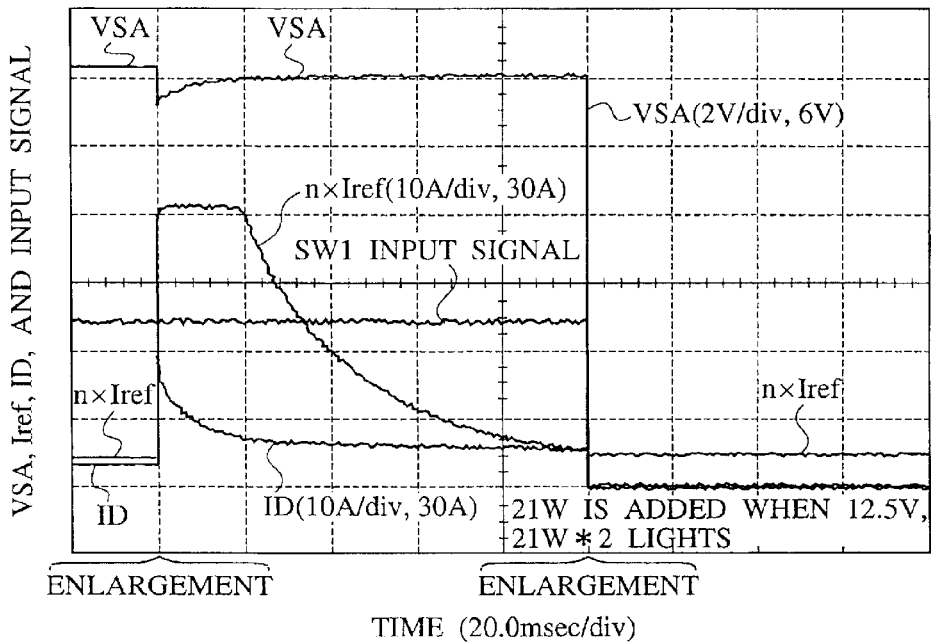
FIGS. 7 and 10 are signal waveform charts of a first switching device with a current type shutdown function in a second embodiment of the present invention (in the case where an overload state is made transitional during the normal use of a load), where

In a second embodiment, a description will be given with respect to an operation of a first switching device 1 in the case where a lamp load is further added, and an overload state occurs when a normal lamp load lights. When the lamp lights, if an attempt is made to illuminate another lamp, the shutdown function works, and all the lamps are turned OFF. A lamp load having two 21W bulb lamps connected in parallel is used as a lamp load that initially lights. One 21W bulb lamp is used as an additional lamp load for overload, and is connected in parallel to two lighting lamps. FIG. 7 is a graph showing signal waveforms of a switching circuit until an overload has been added and shut down occurs when a bulb lights. A time of 20 milliseconds per scale is taken on the horizontal axis. VSA, input signal (gate driving signal) to driver 8, ID, and nxIref are taken on the vertical axis. When nxIref falls, nxIref<ID is established, and QA is shut down.

Figure 8:
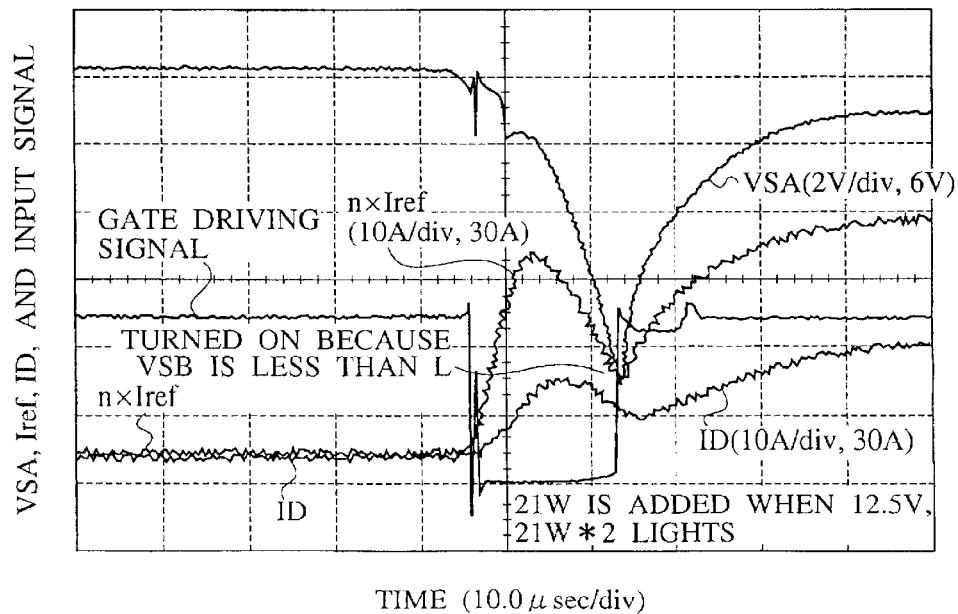
FIG. 8 shows the case where the switch SW1 of FIG. 7 is turned ON by enlarging the time axis by 2,000 times as compared with FIG. 7.

The waveforms of VSA, ID, nxIref, and the input signal (gate driving signal) shown in FIG. 8 are identical to those shown in FIG. 7. The rising points of the waveforms of VSA, ID, and nxIref shown in FIG. 8 are enlarged to 2,000 times that shown in FIG. 7. The respective waveforms are changed in the same way as in FIG. 6. Current ID is greater than nxIref after the time of four scales and a half. By this reversal, the gate driving signal is turned OFF, and. VSA starts decreasing. Then, when VSA decreases, and VSB is equal to or less than level L (potential at point A), the gate driving signal is turned ON again, and VSA, ID, and nxIref rise as well. Therefore, three lamps including an additional one lamp are turned ON.

Figure 9:
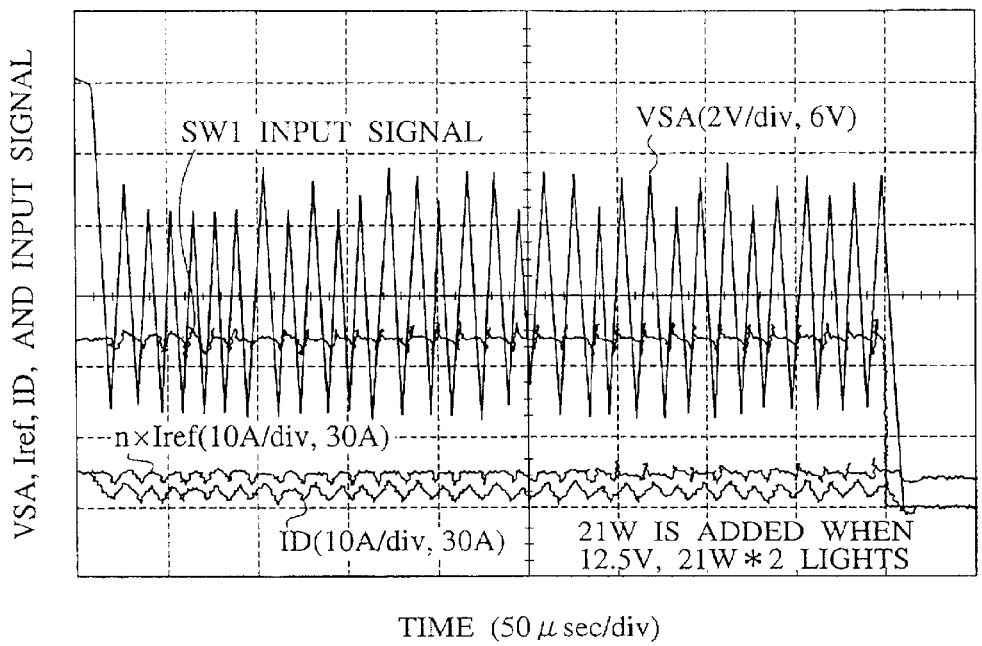
FIG. 9 shows the case where the shutdown function of FIG. 7 works by enlarging the time axis by 400 times as compared with FIG. 7.

The waveforms of VSA, ID, n×Iref, and the input signal (gate driving signal) shown in FIG. 9 are identical to those shown in FIG. 7. Waveforms of VSA, ID, and n×Iref as shown in FIG. 9 display shutdown point which is enlarged to 400 times than shown in FIG. 7. ID is slightly greater than n×Iref in front of a time scale of ¼. By this reversal, an input signal (gate driving signal) is turned OFF again, and VSA and VSB (not shown) decreases. The pulse counter 4 counts this decrease. When VSA and VSB decreases, and VSB is equal to or less than level L (potential at point A), an input signal (gate driving signal) is turned ON again, and VSA, ID, and n×Iref increases as well. When VSA and VSB increases, and VSB is equal to or more than level H (potential at point B), an input signal (gate driving signal) is turned OFF again, and VSA, ID, and n×Iref decrease as well. In this way, when the waveforms fluctuate, and VSA and VSB decrease to 32 times, the input signal (gate driving signal) is fixed to be OFF, and VSA, ID, and VSB (not shown) are not output. Therefore, three lamps including the additional one lamp are turned OFF. The time required from the generation of over-current to current shutdown is set to 100 ms.

Figure 10:
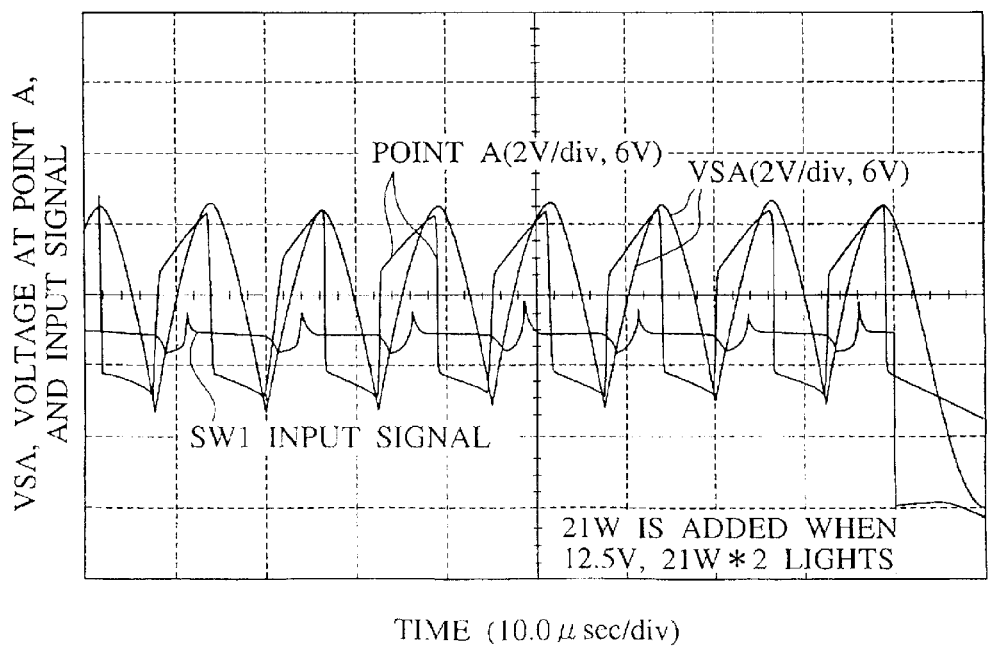

The waveforms of VSA and the input signal (gate driving signal) as shown in FIG. 10 are identical to those shown in FIG. 9. A time shut down at the fall of the waveforms of VSA and the input signal (gate driving signal) as shown in FIG. 10 is enlarged to five times than shown in FIG. 9. The voltage at point A is defined as a dummy voltage. It is found that the voltage at point A has a level H (so called point at point B) of 7V to 8V and level L of about 3V to 4V (so called potential at point A). VSB (not shown) is fluctuated from level L to level H and from level H to level L similar to VSA.

(Third Embodiment (According to First Semiconductor Switching Device 1)

Figure 11:
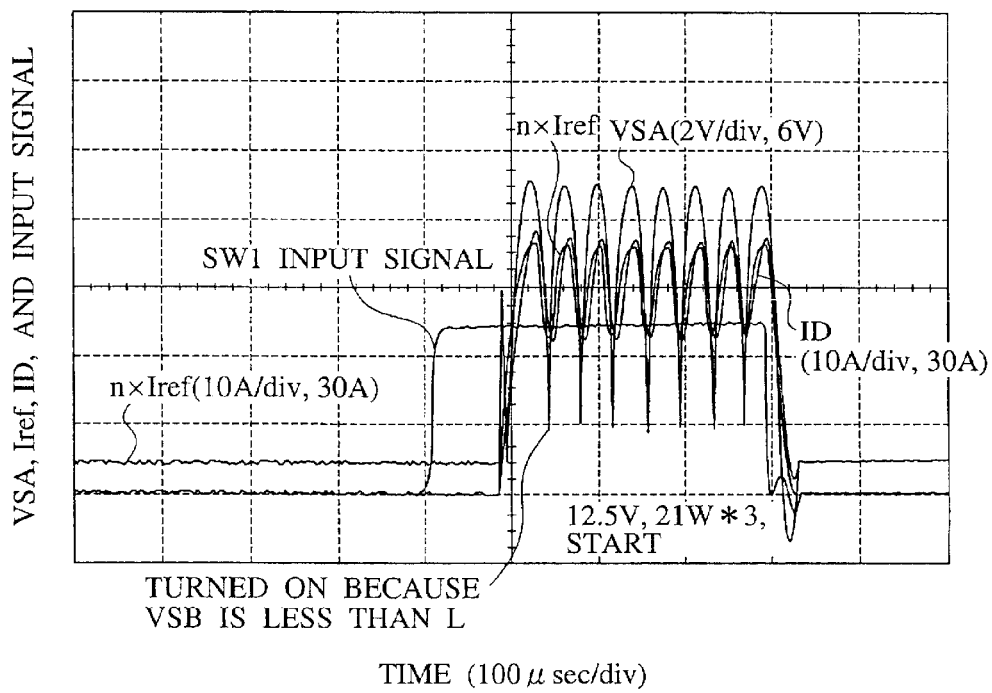
FIG. 11 is a signal waveform chart of a first semiconductor switching device with a current vibration type shutdown function in a third embodiment of the present invention (in the case where an overload state is established after use of a load has been started)

In a third embodiment, a description will be given with respect to a first switching device 1 when a lamp load that is an overload is used. The lamp does not light because a shutdown function has operated. A lamp load 10 is employed as a load having three 21W bulb lamps connected in parallel. In the device 1, n×Iref is set so that overload is obtained by three lamps rather than two lamps. FIG. 11 is a graph showing signal waveforms of a switching circuit from driver input signal ON to shut down. A time of 100 microseconds per scale is taken on the horizontal axis. VSA, input signal, ID, and n×Iref are taken on the vertical axis. QA is shut down when eight ON/OFF operations are repeated. In a process in which ID and n×Iref is increased each time, a current ID that has been smaller than n×Iref is greater than n×Iref close to 35A. By this reversal, QA and QB are turned OFF. VSA and VSB (not shown) turn from increasing to decreasing. When VSB decreases, and VSB is equal to or less than level L, an input signal is turned ON. VSA and VSB increase again. In this way, VSA and VSB fluctuate.

(Second Semiconductor Switching Device 1)

Figure 12:
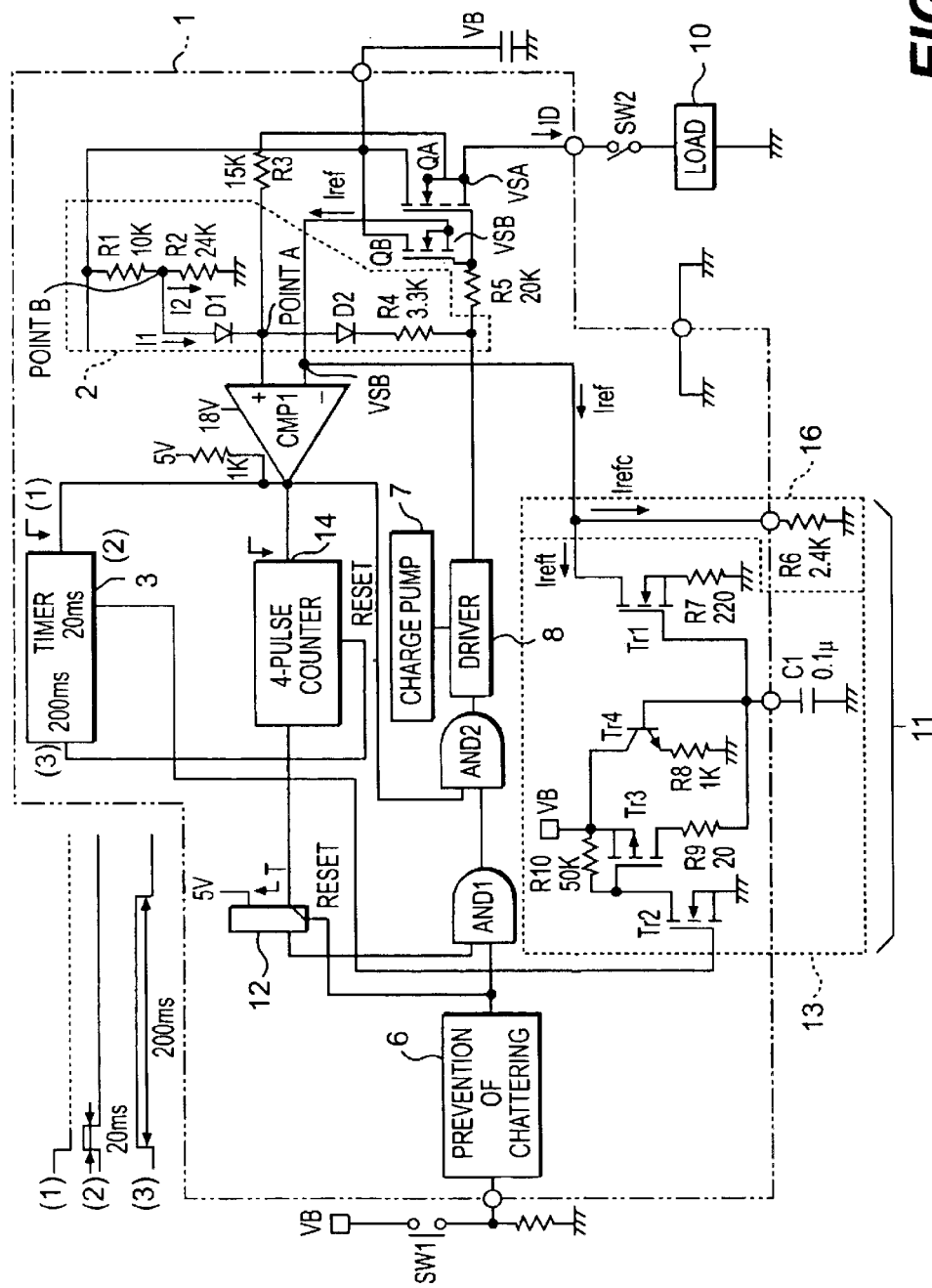
FIG. 12 is a circuit configuration diagram showing a second semiconductor switching device with a current vibration type shutdown function according to the present invention.

A semiconductor switching device 1 with a current vibration type shutdown function can be composed of a circuit as shown in FIG. 12.

A dummy voltage setting circuit 2, a timer 3 and a D flip-flop 12 serving as a shutdown signal holding circuit 5 is identical to the first semiconductor switching device 1 shown in FIG. 2. A pulse counter employs a four-pulse counter 14, unlike FIG. 2. When a signal is input to a reset terminal, the count is cleared. When the signal count from H to L input to an input terminal connected to CMP1 is counted as four is counted, level H is output from an output terminal. The reference current circuit 11 changes from 3 KΩ to 1 KΩ in the resistance value of a resistor R8.

A second semiconductor switching device 1 comprises: a transistor Tr5 that is a multi-source FET including QA and QB; a voltage comparator CMP1 for comparing a relationship in scale between QA source potential VSA and QB source potential VSB; and a gate driving circuit 8 for applying a drive voltage to a gate of Tr5 when VSA is greater than VSB, and shutting down a drive voltage to a gate of Tr5 when VSA is smaller than VSB.

Further, in the semiconductor switching device 1, in the case where VSA is equal to VSB, assuming that a value obtained by dividing a current ID flowing QA by a current Iref flowing QB is defined as "n", a constant component (Irefc) circuit that flows a current Irefc greater than a value obtained by dividing by "n", a value of a current ID in a constant state when a load 10 is within a normal range and a transient component (Ireft) circuit in which a current Ireft greater than a value obtained by dividing by "n", a current ID in a transient state when the load 10 is within a normal range, are disposed in parallel between the reference FET (QB) source and the grounding.

When a current providing the load 10 rapidly increases, and a source potential VSA of a main FET is smaller than a source potential VSB of a reference FET, the device is configured so as to start a transient component Ireft. If a phenomenon occurs in that a transient component circuit 13 is restarted within a third predetermined time after the transient component circuit 13 has started is repeated by a predetermined number of times, a multi-source FET (Tr5) is shut down.

In the case where only a constant component circuit 16, or the constant component circuit 16 and transient component circuit 13 operate, when VSA is smaller than VSB, CMP1 outputs a reversal pulse, and a timer 3 restarts. The 20 ms timer 3 is maintained to be turned ON again by this restart, and thus, the transient component circuit 13 restarts.

After this restart, if a phenomenon occurs in that the transient component circuit 13 is restarted again within a time so that the 200 ms timer 3 is maintained ON is repeated four times, QA is shut down. That is, the timer 3 is restarted within a time so that the 200 ms timer 3 is maintained ON. Because of the restart, the 200 ms timer 3 is continuously maintained ON. Thus, the four-pulse counter 14 is not reset. The inversion pulse of CMP1 is regarded as a continuous pulse by means of the counter 14, and the vibration is counted up without reset.

Next, a description will be given with respect to an operation of a semiconductor switching device 1 with a second current vibration type shutdown function according to the present invention. Judgment between VSA and VSB in scale, setting of Iref or the like, and operation of a dummy voltage circuit are identical to those according to the first semiconductor switching device shown in FIG. 2. However, a resistor R8 or the like are changed. Thus, if the timer output 20 ms is set to L, Tr2 and Tr3 are turned OFF. A charge from capacitor C1 is obtained as a base current of the NPN transistor Tr4, and discharge time constants are different from each other. The discharge time constant is expressed by equation 8 where the current amplification rate "hfe4" of Tr4 is equal to 257.

Discharge time constant when Tr1 gate potential decreases=C1× R8×hfe4=0.1×10$^{-6}$×1×10$^{3}$×257=25.7 ms      Equation 8

As Tr1 gate potential decreases, Ireft decreases. After an output of the 200 ms timer 3 has been connected to a reset terminal of a four-pulse counter 14, when an output of the 200 ms timer 3 is set to level H, the four-pulse counter 14 operates. When the timer is set to level L, the four-pulse counter 14 is reset.

On the other hand, when the timer output 200 ms is set to H, Ireft is set, and VSA>VSB, if a load circuit is normal after QA and QB that have been temporarily turned OFF are turned ON again, in other words, unless a wiring short-circuit or the like occurs, QA and QB continue to be turned ON.

While an output 20 ms of the timer 3 is set to H, in the case where the over-current state Irefxn<ID or the overload state Rr>RLxn, QA and QB are shut down when CMP1 repeats the ON/OFF operation four times. This is a dead short-circuit state. In this case, the heating of QA caused by the ON/OFF operations is large, thus making it possible to shut down QA and QB for a minimally short time.

Figure 13:
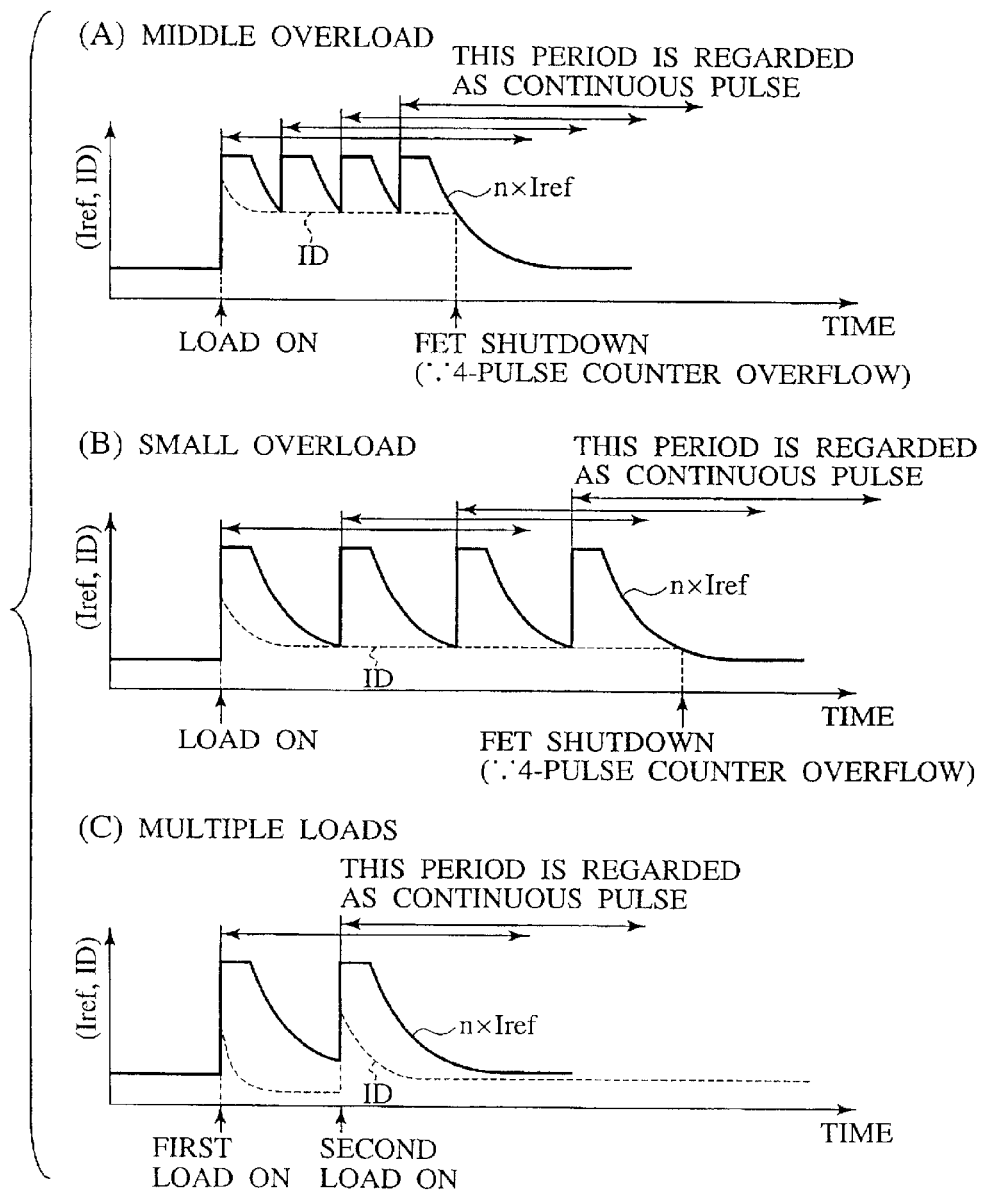
FIG. 13 is a view for illustrating FET shutdown by using a continuous 4-pulse counting system of a second semiconductor switching device with a current vibration type shutdown function.

In addition, in the case where the timer output 20 ms is set to L, and the over-current or overload state is established, the output of CMP1 changes from H to L. Thus, the timer output 20 ms is set to H, and Iref transient component Ireft restarts. At the same time, the output of the 200 ms timer 3 is set to H. Therefore, if a transient component Ireft restarts within 200 ms after the first transient component Ireft has started, the CMP1 output fall count is integrated without the four-pulse counter 14 being reset. As shown in FIGS. 13($a$) and 13($b$), if the transient component Ireft is continuously restarted four times with an interval of within 200 ms regarded as a continuous pulse (vibration), the four-pulse counter 14 overflows, and outputs an output signal. QA and QB are shut down. The 200 ms timer 3 output establishes the condition such that the CMP1 output rise count is integrated. Thus, the so called continuity of the continuous pulse is defined.

In this way, a method of restarting a transient component up to maximum of four times before shutting down the multi-source FET Tr5 has the following effects.

When the transient Ireft is too short, and the time constant defined by the above equation 8 is even zero when the normal transient component on the load side still remains, even in the case where Irefxn<ID, the transient component is restarted, whereby incorrect shutting down of FET can be avoided. If the load is normal, the load transient component is set to zero until the transient component Ireft has been restarted four times.

As shown in FIG. 13($c$), even in the case where a plurality of loads are started with a short interval of less than 200 ms, if the respective loads are normal, switches for the respective loads can be turned ON without incorrect shutdown. That is, in a four-pulse counter system, switching for maximum three loads can be allowed without incorrect shutdown. In the case where plurality of load increases, the counting limit for shutdown may be increased, thereby making it possible to prevent incorrect shutdown.

In the case where chattering has occurred when the switch is turned ON, incorrect operation can be avoided in the same way as in (2).

Figure 18:
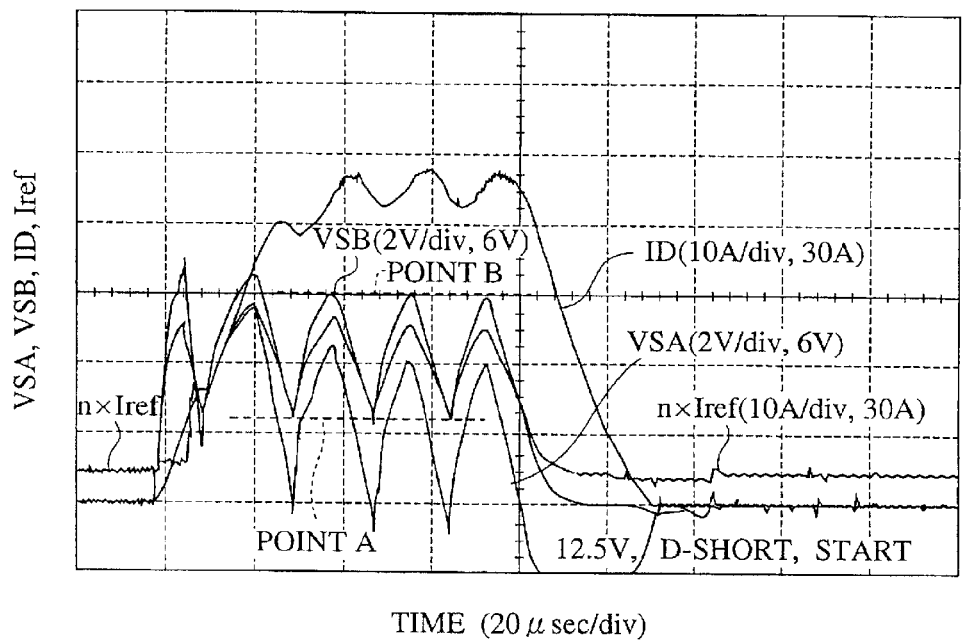
FIG. 18 is a signal waveform chart of a second semiconductor switching device with a current vibration type shutdown function in a fifth embodiment of the present invention (in the case where a dead short state is established after use of a load has been started.
Figure 19:
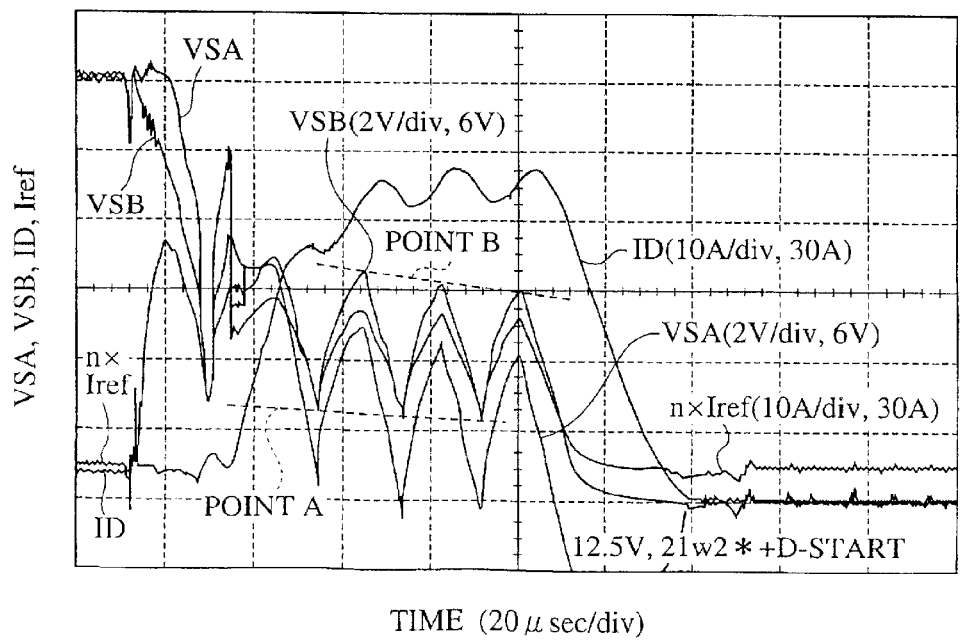
FIG. 19 is a signal waveform chart of a second semiconductor switching device with a current vibration type shutdown function in a modified example of the fifth embodiment of the present invention (in the case where a dead short state is made transitional during the normal use of a load)
Figure 20:
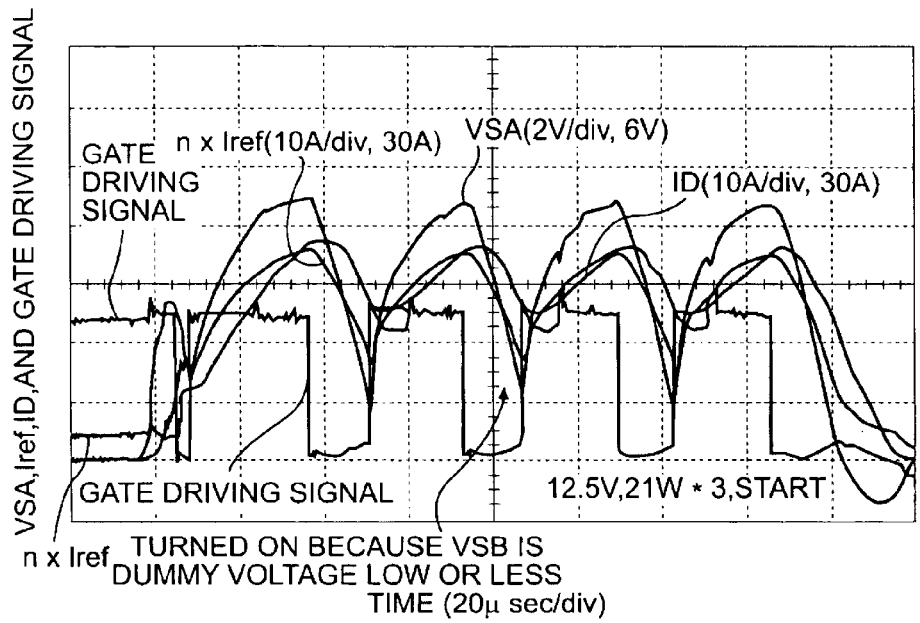
FIG. 20 is a signal waveform chart of a second semiconductor switching device with a current vibration type shutdown function in a sixth embodiment of the present invention (in the case where an overload state is made transitional during the normal use of a load)

The time required for shutdown changes depending on the degree of abnormality. That is, during dead short-circuit, shutdown is achieved within 100 microseconds to 150 microseconds in the four-pulse counter. In FIG. 11, in the case of eight pulses, a time of about 300 microseconds is required for shutdown. If four pulses are obtained, shutdown can be achieved in about half of the above time, as shown in FIGS. 18 to 20 described later. In addition, if an overload is light, four rechecks are performed, and shutdown is achieved within 400 milliseconds to 600 milliseconds with time intervals.

In the case where there is a dead short-circuit, there is a small possibility of incorrect judgment, and quick shutdown is effective in protecting the wires and elements. In addition, in the case where the degree of abnormality is low, there is a high possibility of incorrect judgment, and thus, re-judgment with increased time intervals is effective in avoiding incorrect judgment. In the case where the degree of abnormality is low, the wires and elements are less heated, thus, there is no problem caused by an increased shutdown time. Therefore, this system is reasonable for the protection of over-current or overload.

Moreover, in the case where the degree of abnormality is low, as shown in FIGS. 13($a$) and 13($b$), as the scale of the current ID increases, the time from turning ON the load 10 to FET shutdown can be reduced.

It is possible to detect intermittent overload and over-current. If the timer output is 200 ms, only an intermittent abnormality within 200 ms can be detected. However, a long intermittent abnormality can be detected by increasing the 200 ms time. However, increasing the timer output causes more frequent malfunctions, and thus, such a random increase of the timer output is not preferable.

(Fourth Embodiment (According to Second Switching Device 1))

In a fourth embodiment, description will be given with respect to an operation of a second switching device 1 when a normal lamp load is used. As in the first embodiment, a case in which a lamp does not have a shut-down function, lights, and continuously lights after a period of time is assumed. A lamp load 10 is employed as a load having two 21W bulbs connected in parallel.

Figure 14:
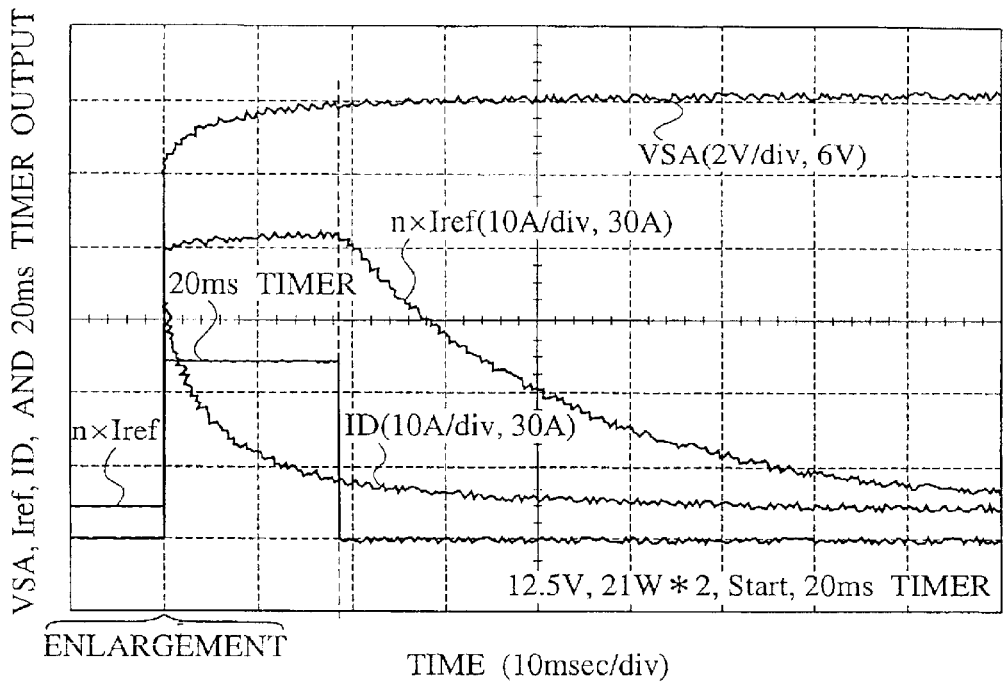
FIGS. 14 to 17 are signal waveform charts of a second semiconductor switching device with a current vibration type shutdown function in a fourth embodiment (normal use of a load), where

FIG. 14 is a graph showing a signal waveform chart of a semiconductor switching device 1 when a bulb lights. The horizontal axis represents time, one scale is defined as 10 milliseconds. On the vertical axis, there are taken: a voltage representing a source potential (VSA) of Tr5 main FET (QA) and a 20 millisecond timer output at an output terminal 2 until 20 milliseconds have been counted from the start of a timer 3; a QA drain current ID; and a drain current nxIref of Tr reference FET (QB). The unit of the vertical axis is indicated on the right of the respective waveform of VSA, ID, and nxIref in the graph. The vertical axis of VSA is represented as (2V/div, 6V), one scale is defined as 2V, and a voltage of the fourth scale of all the eight scales is defined as 6V. Similarly, the vertical axis of ID and nxIref is represented as (10A/div, 30A), one scale is defined as 10A, and a current of the fourth scale in all the eight scales is defined as 30A. In the following graph as well, the vertical axis is expressed by a similar measuring system.

An output of the 20 ms timer 3 is turned ON at a second scale of the time axis, and is turned OFF eighteen milliseconds after the timer has been turned ON. ID starts flowing at the same time as the timer output is turned ON. Although the starting current value reaches 30A, the value then decreases, and is decreased to 8A when the timer output is turned OFF. The current ID is a current that flows to the lamp load 10, and the lamp 10 lights when the current starts flowing. When the current value is further decreased to 4A, the lamp 10 continuously lights normally. The current of 4A is a constant component of ID, and a component obtained as a transient component by subtracting a component of current 4A from a current value that exceeds current 4A when the current starts flowing. For nxIref, 5A of a constant component nxIrefc flows before ID is turned ON. This starting current value reaches 40A. The value nxIref from a time when signal of the 20 ms timer 3 is turned ON to when the timer is turned OFF is fixed to about 40A, and decreases after the timer has been turned OFF. The ID current value is lower than nxIref at any time. Therefore, VSA is greater than VSB at any time, and an over-current is not generated. For VSA, a voltage is increased at the same time as when ID is turned ON. A voltage exceeding 12V is applied to a lamp load 10. When n×Iref>ID, FET is continued to be turned ON.

Figure 15:
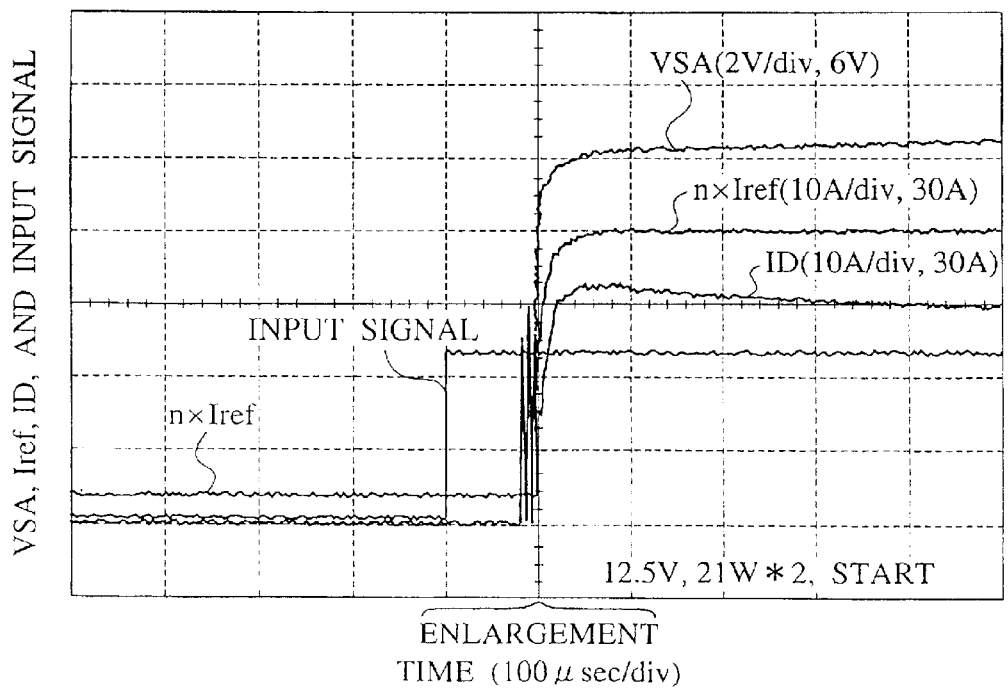

The waveforms of VSA, ID, and n×Iref shown in FIG. 15 are identical to those shown in FIG. 14. The figure shows a relation with an ON signal of an input signal (gate driving signal) of a driver 8 such as SW1 generated when the switch SW1 is turned ON. Depending on the rise delay of the charge pump 7, a delay of about 80 microseconds occurs from when the SW1 input signal (gate driving signal) is turned ON to a rise of ID or the like.

Figure 16:
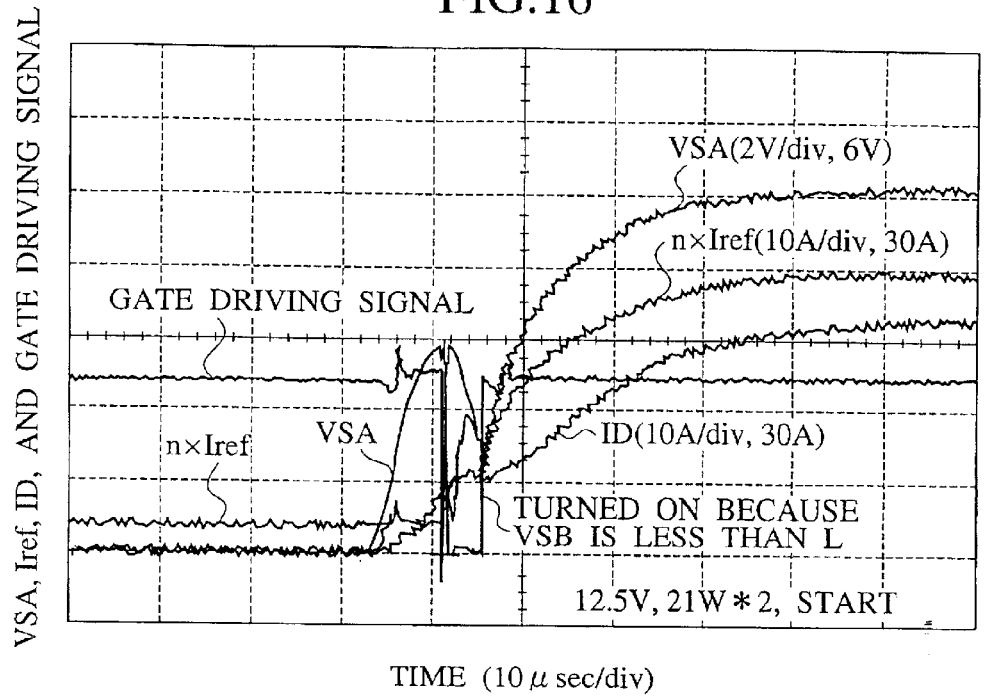

The waveforms of VSA, ID, and n×Iref shown in FIG. 16 are identical to those shown in FIG. 15. A rise time of the waveforms of VSA, ID, and n×Iref shown in FIG. 16 is enlarged by 10 times than shown in FIG. 15. Therefore, ID is greater than n×Iref at a time of three scales and a half. In the reversal, the gate driving signal is turned OFF, and the increased VSA and VSB (not shown) start to decrease. Then, when VSB decreases, and VSB is equal to or less than level L (potential at point A), an input signal (gate driving signal) is turned ON again, and VSA, VSB, ID, and n×Iref rise as well.

Figure 17:
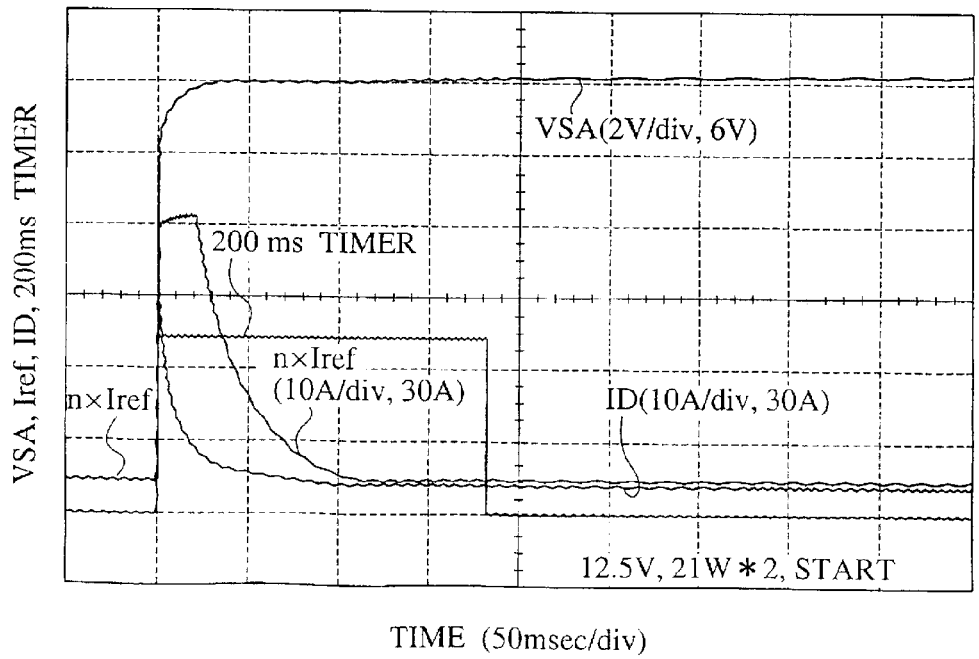

The waveforms of VSA, ID, and n×Iref in FIG. 17 are identical to those in FIG. 14. The figure shows a relation with a 200 ms timer 3, where the time axis on the horizontal axis is reduced to ⅕. Therefore, the timer output 200 ms is turned ON at the second scale of the time axis, and is turned OFF 180 milliseconds after the output has been turned ON. Current ID starts flowing at the same time as when the timer output is turned ON. Although the starting current value reaches 30A, the value then decreases, and is constant at 4A before the timer output is turned OFF. For n×Iref, 5A of a constant component n×Irefc flows before the timer output is turned ON. Then, a transient component n×Ireft starts flowing at the same time as when the timer output is turned ON. Although this starting current value reaches 40A, the value then decreases. A transient component n×Ireft is eliminated before the timer output is turned OFF, and only 5A of the constant component n×Irefc flows.

(Fifth Embodiment 5 (According to Second Semiconductor Switching Device 1))

In a fifth embodiment, a description will be given with respect to the operation of a second semiconductor switching device 1 according to the present invention when wiring between QA and a load 10 is short circuited.

FIG. 18 shows the waveforms when switch SW1 is turned ON while wiring between QA and the load 10 is a short circuit.

Current ID flowing in a shortened state exceeds n×Iref, and thus, QA and QB that have been temporarily turned ON are turned OFF. A voltage lower than VSA is input to a +input terminal of CMP1. Thus, even when VSA slightly fluctuates, if its fluctuation width is smaller than the voltage fall of R3, CMP1 is stabilized, and a dummy voltage is maintained to level L (potential at point A in equation 5 and point A in FIG. 18). When QA continues to be turned OFF, VSA is lowered towards GND, and the QA gate potential is lowered as well. The QB gate is linked directly with QA gate, and thus, as VSA is lowered, VSB is also lowered. As VSA is decreased, the potential at point A is slightly lowered, but its lowering quantity is slight. The potential at point A is supplied to a +terminal of CMP1, and the potential of VSB is supplied to a −terminal, thus, a relationship is established as +terminal potential of CMP1>−terminal potential of CMP1, and the output of CMP1 is reversed from L to H. The gate driver 8 is turned ON again, QA and QB are turned ON, and VSA and VSB begin to rise. An output of the gate driver 8 rises from 0V to Vp, and thus, D2 is reversely biased. The potential at point A rises as VSA rises. At this time, a relationship is established as potential at point A>VSA. The potential at point A rises up to the potential at point B in equation 6 (dummy voltage level H and point B in FIG. 18). After VSB has risen by turning on QB, when VSB is equal to or more than H, an output of CMP1 is inverted from H to L. The pulse counter 14 counts a first count. The gate driver 8 is turned OFF again, and QA and QB are turned OFF. QA and QB are repeatedly turned ON/OFF, and the counter 14 increases the number of counts every time. A signal from the counter 14 is output at the fourth count, the gate driver 8 is turned OFF again, and QA and QB are turned OFF. The time required from the generation of a short-circuit to current shutdown is set to 110 microseconds.

FIG. 19 shows waveforms when a load 10 is employed as a load having two 21W bulb lamps connected in parallel, thereby dead-shorting wiring between QA and the load 10 when two lamps light. ON/OFF operations of QA and QB similar to those shown in FIG. 18 are repeated. The time required from the generation of a short-circuit to current shutdown is set to 130 microseconds.

(Sixth Embodiment (According to Second Semiconductor Switching Device 1))

In a sixth embodiment, an operation will be described with respect to a second switching device 1 when a lamp load being an overload is used. In this case, a lamp does not light because a shutdown operation has been performed. A lamp 10 is employed having three 21W bulb lamps connected in parallel. In the device 1, n×Iref is set so that an overload is obtained by three lamps without such an overload being obtained by two lamps. FIG. 20 is a graph showing signal waveforms of a switching device from the driver input signal ON to shut down. A time of 20 microseconds per scale is taken on the horizontal axis. VSA, gate driving signal, ID, and n×Iref are taken on the vertical axis. A multi-source FET Tr5 is shut down at the time when ON/OFF operations are repeated four times. Whenever both ID and n×Iref become larger, current ID that has been smaller than n×Iref is greater than n×Iref close to 35A. In the reversal, the gate driving signal is turned OFF, and VSA changes from an increase to a decrease. When VSA decreases, and is equal to or less than level L of the dummy voltage, an input signal is turned ON, and VSA increases again. In this way, VSA vibrates. The four-pulse counter 14 counts vibration of VSA via CMP1. When this count falls into the fourth count, the counter 14 outputs an ON signal, and an input signal of the driver 8 is turned OFF. When this fourth count is obtained, the timer 3 is also turned ON, and Iref flows. Therefore, ID is recovered to be smaller than n×Iref. This recovery does not cause VSA and ID to be turned ON again. Three lamps of the load 10 are turned OFF. The time required from switch ON to current shutdown is set to 185 microseconds.

(Seventh Embodiment (According to Second Semiconductor Switching Device 1))

Figure 21:
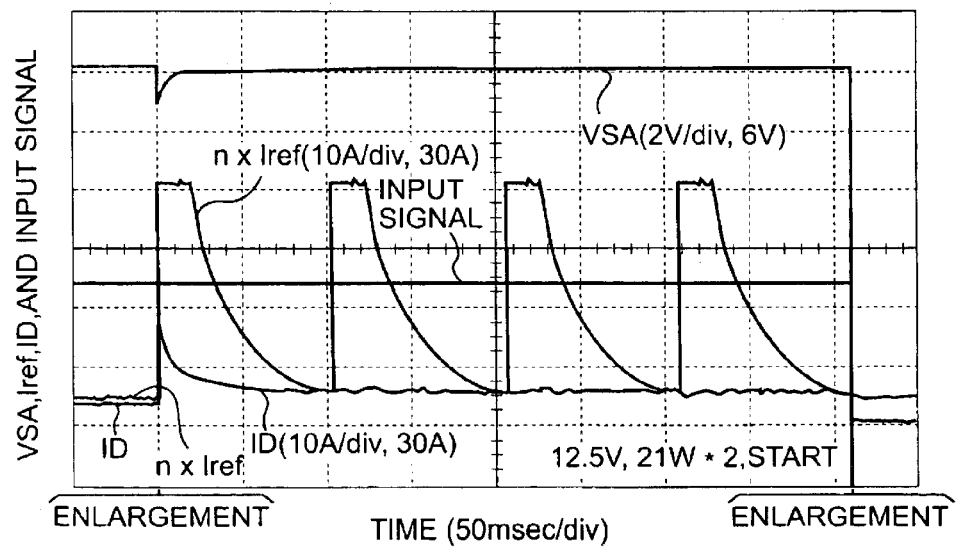
FIGS. 21 to 23 are signal waveform charts of a second semiconductor switching device with a current vibration type shutdown function in a seventh embodiment of the present invention (in the case where an overload state is made transitional during the normal use of a load), where

In a seventh embodiment, a description will be described with respect to the operation of a second switching device 1 in the case where an overload state occurs when a normal lamp load lights, and a further lamp load is added. When a lamp lights, if an attempt is made to further illuminate another lamp, a shutdown function occurs, and all the lamps are turned OFF. The lighting of the lamp load from the start is employed as a lamp having two 21W bulb lamps connected in parallel. A lamp load to be added to use for overload is a load having one bulb lamp connected to the lighting two lamps. FIG. 21 is a graph showing signal waveforms of a switching circuit until shutdown has been achieved after an overload has been added during bulb illumination. A time of 50 milliseconds per scale is taken on the horizontal axis. VSA, input signal to driver 8, ID, and n×Iref are taken on the vertical axis.

The waveforms shown in FIG. 21 correspond to those in the case of a middle overload shown in FIG. 13(a) and a small overload shown in FIG. 13(b). Ireft of n×Iref starts four times repeatedly. A start interval is set to about 105 milliseconds, and is smaller than 200 ms of the timer 3. The time required from generation of an over-current to current shutdown is set to 420 milliseconds.

Figure 22:
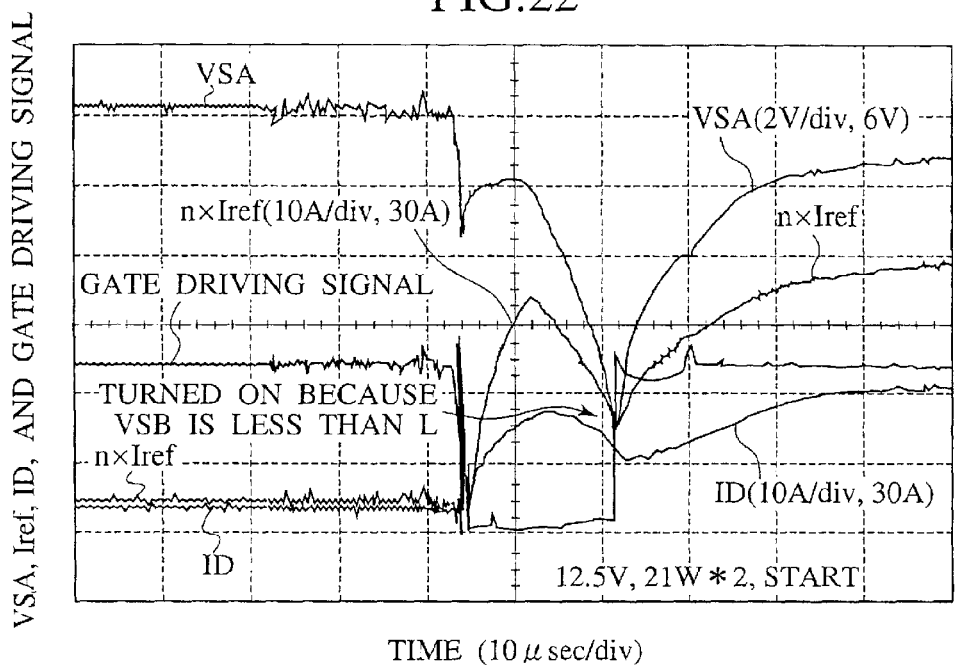

The waveforms of VSA, ID, n×Iref, and the input signal in FIG. 22 are identical to those in FIG. 21. A rise time of the waveforms of VSA, ID, and n×Iref in FIG. 22 is enlarged to 5,000 times than shown in FIG. 21. The respective waveforms are changed in the same way as in FIG. 8. ID is greater than n×Iref at a time of four scales and a half. In the reversal, the gate driving signal is turned OFF, and VSA starts decreasing. Then, if VSA decreases, and is equal to or less than level L of the dummy voltage, the gate driving signal is turned ON again, and VSA, ID, and n×Iref increase as well. Three lamps including the added one lamp are turned ON.

Figure 23:
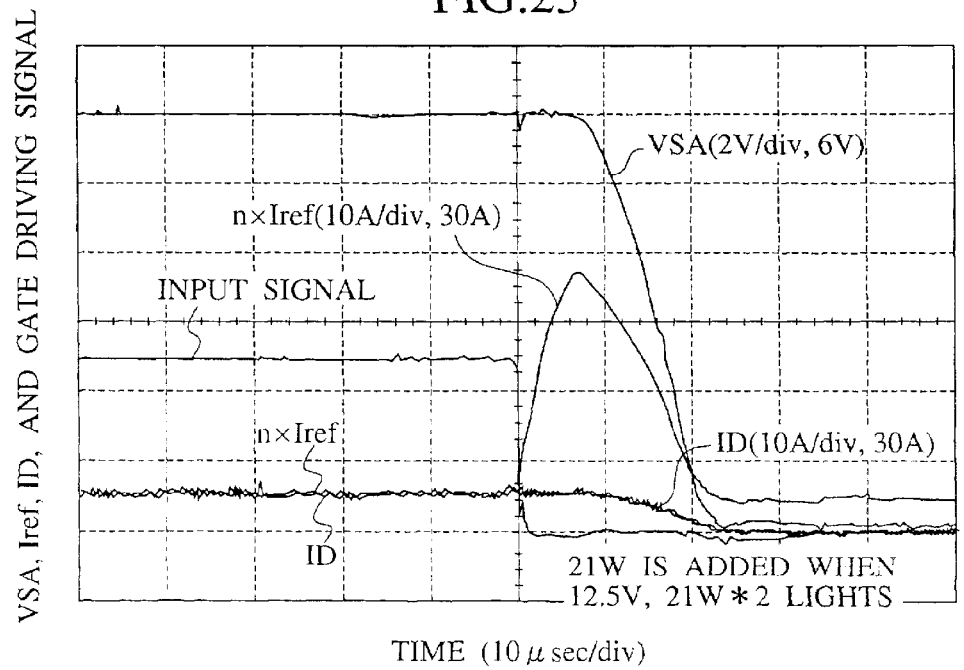

The waveforms of VSA, ID, n×Iref, and the input signal in FIG. 23 are identical to those in FIG. 21. The waveforms of VSA, ID, and n×Iref shown in FIG. 23 display shutdown point, which is enlarged to 5,000 times than shown in FIG. 21. ID is slightly greater than n×Iref, whereby an input signal is turned OFF, and VSA decreases. The four-pulse counter 14 counts this decrease. This count falls into a fourth count, and thus, the counter 14 outputs an ON signal. An input signal of the driver 8 is turned OFF. When this fourth count is obtained, the timer 3 is turned ON, and Iref flows. Therefore, current ID is recovered to be smaller than n×Iref. This recovery does not cause VSA and ID to be turned ON again. Three lamps including the additional lamp are turned OFF.

As described above, according to the present invention, there can be provided a semiconductor switching device capable of detecting an over-current even when a rush current is generated, and capable of responding at a high speed to an over-current in the case where a layer short-circuit such as incomplete short-circuit having a certain short-circuit resistance is generated.

In addition, according to the present invention, a reference circuit includes a constant component and a transient component. Thus, a normal state is handled with respect to a transient phenomenon (transient component) generated on the load side, and ON/OFF operation is not performed. Thus, a problem such as lamp illumination delay is eliminated, and the heating of an element can be reduced.

According to the present invention, a transient component of the reference circuit can be started according to a change on the load side, thus, making it possible to substitute a fuse function.

According to the present invention, a dummy voltage of two levels is employed for current vibration control. Thus, a delay element of the gate driving circuit of a multi-source FET is not required, ON/OFF operation is stabilized, and ON/OFF operation characteristics can be easily controlled.

According to the present invention, a transient component is incorporated in a reference, thus making it possible to change the shutdown time when an abnormality occurs due to the scale of the transient component. Specifically, in the case where an abnormality occurs when the transient component is great or in the case where such an abnormality has occurred, a method for achieving shorter shutdown for protection can be established. Thus, even in the case where a current restriction during dead-shorting is insufficient, the time required for shutdown is reduced, thereby making it possible to reduce a diameter of wiring. In addition, the heating of an element can be restricted, making it unnecessary to provide a specific current restriction circuit. In this manner, the control circuit is simplified, thus making it possible to reduce the element chip area or integrate the FET and control circuit on one chip, resulting in cost reduction.

Further, according to the present invention, the ON/OFF control count of the semiconductor switch due to control means (control steps) is counted by means of a pulse counter. When this control count reaches a predetermined count, the semiconductor switch is controlled to be turned OFF. Thus, even in an incomplete short-circuit, the shutdown of the semiconductor switch can be accelerated to an arbitrary set time, and a high speed response can be achieved.

In particular, in the case where ON/OFF control of the semiconductor switch is integrated in a monolithic manner, no microcomputer is required. Thus, the chip area can be reduced, and equipment cost can be remarkably reduced.

Various modifications will become possible for those skilled in the art after receiving the teachings of the present disclosure without departing from the scope thereof.

What is claimed is:

1. A semiconductor switching device comprising:
   a multi-source field effect transistor including a main source electrode having a main source potential and a reference source electrode having a reference source potential;
   a voltage comparator for detecting whether the main source potential is lower than the reference source potential:
   a gate driving circuit including the multi-source field effect transistor in an ON state when the main source potential is higher than the reference source potential, and in an OFF state when the main source potential is lower than the reference source potential based on the voltage comparator detection;
   a reference current setting circuit for feeding a reference current including a constant component current and a transient component current to the reference source electrode so that the main source potential is not lower than the reference source potential, and so that the transient current component starts to be fed whenever the voltage comparator detects that the main source potential is lower than the reference source potential;
   a counter for counting the number of vibrations of the main source potential to a predetermined number of times on the basis of the detecting of the voltage comparator, and the gate driving circuit turns OFF the multi-source field effect transistor when the counter exceeds the predetermined number.

2. The device as claimed in claim 1, wherein operation of the counter is cancelled when an interval between any two successive detections by the voltage comparator is longer than a predetermined interval.

3. The device as claimed in claim 1, further comprising a dummy voltage setting circuit,
   wherein the vibration of the main source potential, is a repetition of an ON/OFF operation of the multi-source field effect transistor at the main source electrode and wherein:

the voltage comparator detects that the main source potential is lower than the reference source potential, whereby the gate driving circuit turns OFF the multi-source field effect transistor;

the dummy voltage setting circuit sets a first potential lower than the main source potential; and the voltage comparator detects that the reference source potential becomes greater than the second potential, and becomes greater than the main source potential, whereby the gate driving circuit turns OFF the multi-source field effect transistor.

4. The device as claimed in claim 1, wherein, when the main source potential is equal to the reference source potential, an "n" value is obtained when a load current is divided by the reference current, and wherein the reference current setting circuit comprises:

a constant component circuit providing a constant component, current which is greater than a value obtained by dividing a current value in a constant state when the load current is outside the range of the over-current by "n"; and a transient component circuit providing the transient component, current which is greater than a value obtained by dividing a current value of a transient component in a transient state when the load current is outside the range of the over-current by "n".

5. The device as claimed in claim 4, wherein the transient component circuit provides the transient component current at a first predetermined time and at a constant current value; and wherein the transient current component is decreased within a range such that the reference source potential does not exceed the main source potential, and is set to zero within a second predetermined time after the first predetermined time has elapsed.

6. The device as claimed in claim 5, wherein the transient component circuit feeding the transient component current is started by the voltage comparator detecting that the main source potential is lower than the reference source potential, and is not started within the second predetermined time.

7. The device as claimed in claim 5, wherein a predetermined number of vibrations in the first predetermined time is less than a predetermined number of vibrations in the second predetermined time.

8. An over-current shutdown method comprising:

a step of feeding a reference current including a constant component current and a transient component current to a reference source electrode so that a main source potential a multi-source field effect transistor at a main source electrode is provided when a load current flowing at the main source electrode containing a transient component is not within the range of an over-current and is not lower than the reference source potential of the multi-source field effect transistor at a reference source electrode;

a step of detecting that the main source potential is less than the reference source potential;

a step of starting the reference current to vibrate when the main source potential is less than the reference source potential, a step of counting a number of vibrations a predetermined number of times; and a step of turning OFF the multi-source field effect transistor by counting the number of vibrations.

* * * * *

UNITED STATES PATENT AND TRADEMARK OFFICE
CERTIFICATE OF CORRECTION

PATENT NO.   : 6,831,821 B2
DATED        : December 14, 2004
INVENTOR(S)  : Shunzou Ohshima It is certified that error appears in the above-identified patent and that said Letters Patent is hereby corrected as shown below:

Column 24,
Line 37, "potential:" should read -- potential; --.

Signed and Sealed this

Nineteenth Day of July, 2005

JON W. DUDAS
*Director of the United States Patent and Trademark Office*